(12) United States Patent
Hirose

(10) Patent No.: US 10,447,141 B2
(45) Date of Patent: Oct. 15, 2019

(54) WAVEFORM SHAPING CIRCUIT, SEMICONDUCTOR DEVICE, AND SWITCHING POWER SUPPLY DEVICE

(71) Applicant: FUJITSU LIMITED, Kawasaki-shi, Kanagawa (JP)

(72) Inventor: Tatsuya Hirose, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/223,228

(22) Filed: Dec. 18, 2018

(65) Prior Publication Data

US 2019/0229604 A1 Jul. 25, 2019

(30) Foreign Application Priority Data

Jan. 25, 2018 (JP) ................................. 2018-010220

(51) Int. Cl.
*H02M 1/08* (2006.01)
*H02M 3/335* (2006.01)
*H03K 17/687* (2006.01)
*H03F 3/45* (2006.01)

(52) U.S. Cl.
CPC ......... *H02M 1/08* (2013.01); *H02M 3/33592* (2013.01); *H03F 3/45179* (2013.01); *H03K 17/687* (2013.01); *H03F 2203/45022* (2013.01)

(58) Field of Classification Search
CPC ......... H02M 3/33576; H02M 3/33592; H02M 1/08; H02M 1/4208; H02M 7/219; H03F 3/45179; H03F 2203/45022; H03K 17/687; Y02B 70/126

USPC ............................... 363/21.06, 21.14, 44, 81
See application file for complete search history.

(56) References Cited

U.S. PATENT DOCUMENTS

| | | | | |
|---|---|---|---|---|
| 3,328,638 A | * | 6/1967 | Reis | H02H 3/04 361/67 |
| 3,510,676 A | * | 5/1970 | Pierce, Jr. | H03K 3/352 219/130.51 |
| 3,588,655 A | * | 6/1971 | Egan | H02P 7/293 388/830 |
| 4,961,170 A | * | 10/1990 | Maki et al. | G05F 3/22 365/177 |
| 2015/0131350 A1 | * | 5/2015 | Isomura | H02M 1/38 363/131 |
| 2018/0159313 A1 | * | 6/2018 | Hirose | H02H 7/1252 |

FOREIGN PATENT DOCUMENTS

| JP | H10-232384 A | 9/1998 |
|---|---|---|
| JP | 6160762 B1 | 7/2017 |
| JP | 2018-093678 A | 6/2018 |
| WO | 2013/157086 A1 | 10/2013 |

* cited by examiner

*Primary Examiner* — Yemane Mehari
(74) *Attorney, Agent, or Firm* — Fujitsu Patent Center

(57) ABSTRACT

A waveform shaping circuit includes a first parallel circuit including a first capacitance element and a first resistance element coupled in parallel with each other, a positive pulse voltage being applied to a first terminal of the first capacitance element and a second terminal of the first resistance element, a first rectifier circuit disposed between a point of coupling between a third terminal of the first capacitance element and a fourth terminal of the first resistance element and an output terminal.

4 Claims, 20 Drawing Sheets

FIG. 20
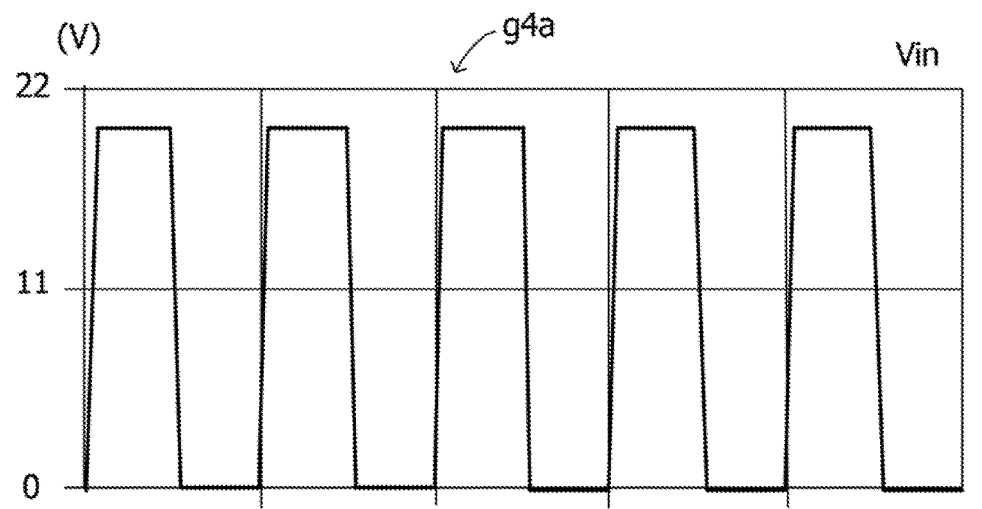
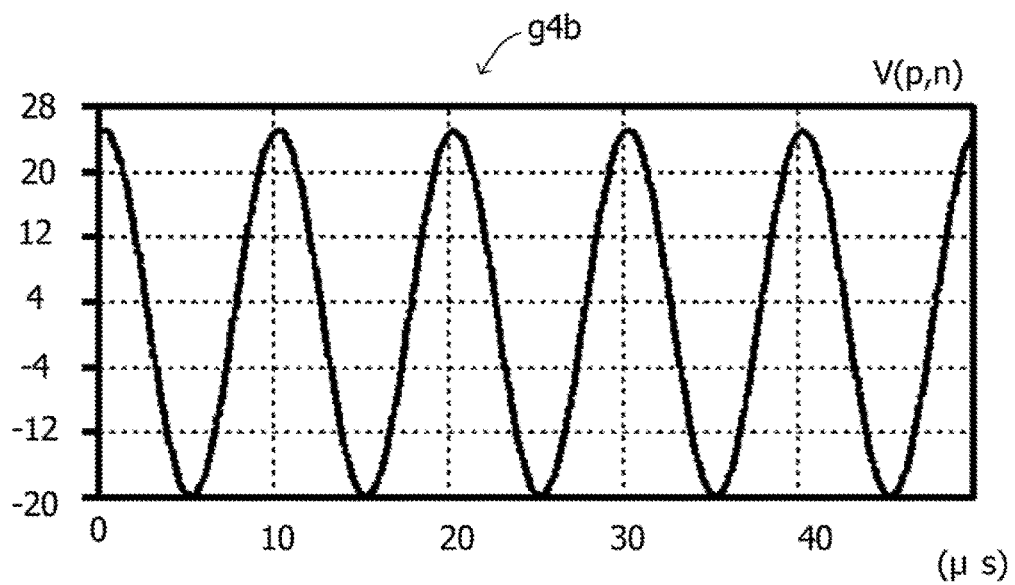

WAVEFORM SHAPING CIRCUIT, SEMICONDUCTOR DEVICE, AND SWITCHING POWER SUPPLY DEVICE

CROSS-REFERENCE TO RELATED APPLICATION

This application is based upon and claims the benefit of priority of the prior Japanese Patent Application No. 2018-10220, filed on Jan. 25, 2018, the entire contents of which are incorporated herein by reference.

FIELD

The embodiments discussed herein are related to a waveform shaping circuit, a semiconductor device, and a switching power supply device.

BACKGROUND

A field effect transistor (FET) is used in a switching power supply device used as an alternating current (AC)/direct current (DC) converter or a DC/DC converter or a semiconductor device such as an amplifier or the like. A silicon (Si)-metal-oxide-semiconductor (MOS) FET, for example, is widely used as the FET. In recent years, a dedicated control integrated circuit (IC) has often been used as a control circuit that performs on-off control of the FET. A gate drive voltage of the Si-MOSFET is 7 to 20 V. The control IC therefore outputs a gate voltage in that range in many cases.

Meanwhile, in recent years, a high electron mobility transistor referred to as a high electron mobility transistor (HEMT) has been developed. As a typical HEMT, there is a GaN-HEMT using a compound semiconductor of gallium nitride (GaN) having a small on-resistance.

Incidentally, a technology is proposed which suppresses an overvoltage on a positive side in a switching power supply device using GaN in a switching element. In addition, a technology is proposed which operates a driving circuit by a power supply of a single polarity.

GaN-HEMTs that may be used in amplifiers are of a normally on type, and many of the GaN-HEMTs adopt a Schottky gate. A gate voltage thereof is therefore negative, and is in a range of −8 to 0 V, for example.

It is difficult for a control IC that assumes the use of a Si-MOSFET to drive a FET for which a negative voltage is used, such as a normally on type GaN-HEMT having the characteristics as described above or the like. A negative power supply may be added to generate the negative voltage. However, a circuit scale is increased.

The followings are reference documents.
[Document 1] Japanese Patent No. 6160762 and
[Document 2] Japanese Laid-open Patent Publication No. 10-232384.

SUMMARY

According to an aspect of the embodiments, a waveform shaping circuit includes a first parallel circuit including a first capacitance element and a first resistance element coupled in parallel with each other, a positive pulse voltage being applied to a first terminal of the first capacitance element and a second terminal of the first resistance element, a first rectifier circuit disposed between a point of coupling between a third terminal of the first capacitance element and a fourth terminal of the first resistance element and an output terminal, the first rectifier circuit interrupting a current flowing in a direction from the third terminal and the fourth terminal to the output terminal, a second parallel circuit including a second capacitance element and a second resistance element coupled in parallel with each other, a fifth terminal of the second capacitance element and a sixth terminal of the second resistance element being at a reference potential, a Zener diode disposed between a point of coupling between a seventh terminal of the second capacitance element and an eighth terminal of the second resistance element and the point of coupling between the third terminal and the fourth terminal, the Zener diode interrupting a current flowing in a direction from the seventh terminal and the eighth terminal to the third terminal and the fourth terminal at a time of application of a voltage equal to or higher than a Zener voltage, and a second rectifier circuit having one terminal coupled to the seventh terminal and the eighth terminal, and having another terminal at the reference potential, the second rectifier circuit interrupting a current flowing in a direction from the seventh terminal and the eighth terminal to the reference potential.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 20 is a diagram illustrating an example of an input waveform and an output waveform of a sine wave generating device.

DESCRIPTION OF EMBODIMENTS

A mode for carrying out the technology will hereinafter be described with reference to the drawings.

First Embodiment

Figure 1:
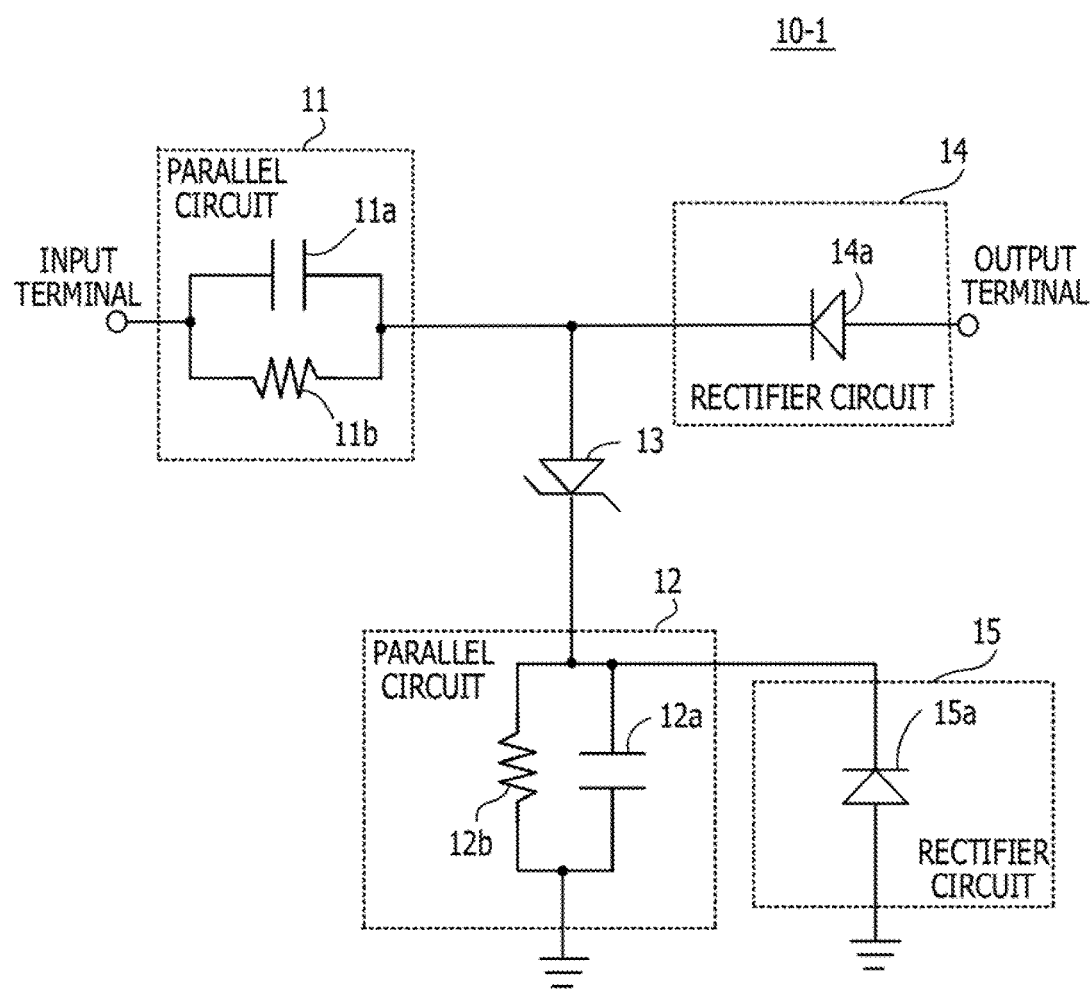
FIG. 1 is a diagram illustrating an example of a waveform shaping circuit according to a first embodiment.

FIG. 1 is a diagram illustrating an example of a waveform shaping circuit according to a first embodiment. A waveform shaping circuit 10-1 includes a parallel circuit 11, a parallel circuit 12, a Zener diode 13, and rectifier circuits 14 and 15.

The parallel circuit 11 includes a capacitor 11a and a resistance element 11b coupled in parallel with each other. The parallel circuit 12 includes a capacitor 12a and a resistance element 12b coupled in parallel with each other. One terminal of the capacitor 11a and one terminal of the resistance element 11b are coupled to an input terminal of the waveform shaping circuit 10-1.

A rectifier circuit 14 is provided between other terminals of the capacitor 11a and the resistance element 11b and an output terminal. The rectifier circuit 14 interrupts a current flowing in a direction from the other terminals to the output terminal. In the example of FIG. 1, the rectifier circuit 14 includes a diode 14a. The diode 14a has an anode coupled to the output terminal, and has a cathode coupled to the parallel circuit 11.

In addition, the Zener diode 13 is provided between the other terminals of the capacitor 11a and the resistance element 11b and one terminals of the capacitor 12a and the resistance element 12b. When a voltage equal to or higher than a Zener voltage is applied to the Zener diode 13, the Zener diode 13 interrupts a current flowing in a direction from the one terminals of the capacitor 12a and the resistance element 12b to the other terminals of the capacitor 11a and the resistance element 11b. In the example of FIG. 1, the Zener diode 13 has an anode coupled to the parallel circuit 11, and has a cathode coupled to the parallel circuit 12.

Other terminals of the capacitor 12a and the resistance element 12b are coupled to an element at a reference potential (hereinafter referred to as a GND).

One terminal of a rectifier circuit 15 is coupled to the one terminals of the capacitor 12a and the resistance element 12b. Another terminal of the rectifier circuit 15 is coupled to the GND. The rectifier circuit 15 interrupts a current flowing in a direction from the one terminals of the capacitor 12a and the resistance element 12b to the GND. In the example of FIG. 1, the rectifier circuit 15 includes a diode 15a. The diode 15a has an anode coupled to the GND, and has a cathode coupled to the parallel circuit 12. Incidentally, the diode 15a may be a Zener diode.

Even though such a waveform shaping circuit 10-1 does not have a negative power supply (external power supply), the waveform shaping circuit 10-1 provides a negative voltage from the output terminal when a positive pulse voltage is applied to the input terminal. Prior to description of reasons therefor, examples of a voltage converting circuit that generates a negative voltage will be illustrated in the following as comparative examples for comparison with the waveform shaping circuit 10-1 according to the first embodiment.

Comparative Examples

Figure 2:
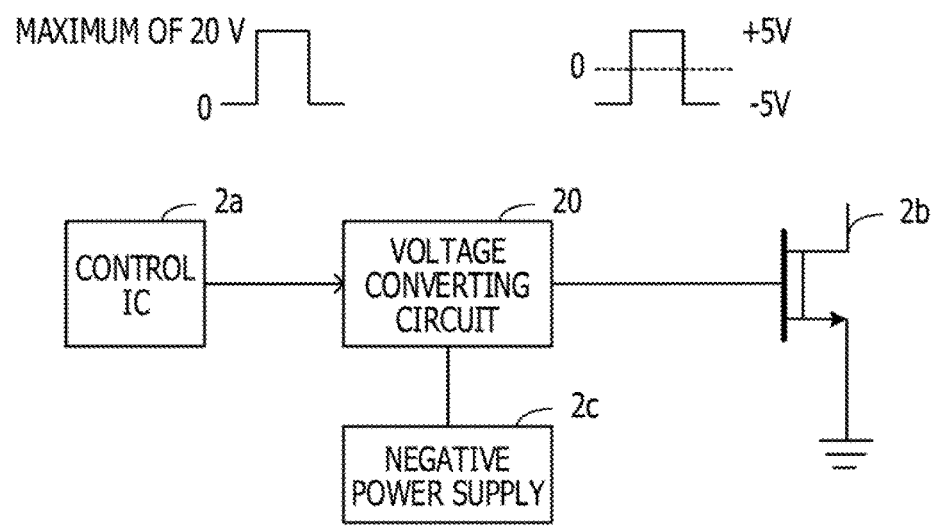
FIG. 2 is a diagram Illustrating an example of a mode of coupling of a control IC of a switching power supply device, a voltage converting circuit, and a GaN-HEMT.

FIG. 2 is a diagram illustrating an example of a mode of coupling of a control IC of a switching power supply device, a voltage converting circuit, and a GaN-HEMT. A voltage converting circuit 20 is located between a control IC 2a of a switching power supply device and a GaN-HEMT 2b as a switching element.

The voltage converting circuit 20 converts a control voltage output from the control IC 2a to a given voltage, and applies the voltage after the conversion as a gate voltage to a gate terminal of the GaN-HEMT 2b.

In a case where the control voltage output from the control IC 2a is 0 V to a maximum of 20 V, for example, the voltage converting circuit 20 generates the gate voltage in a range of −5 to +5 V. The voltage converting circuit 20 thus generates a negative voltage. A negative power supply 2c is therefore coupled to the voltage converting circuit 20.

Figure 3:
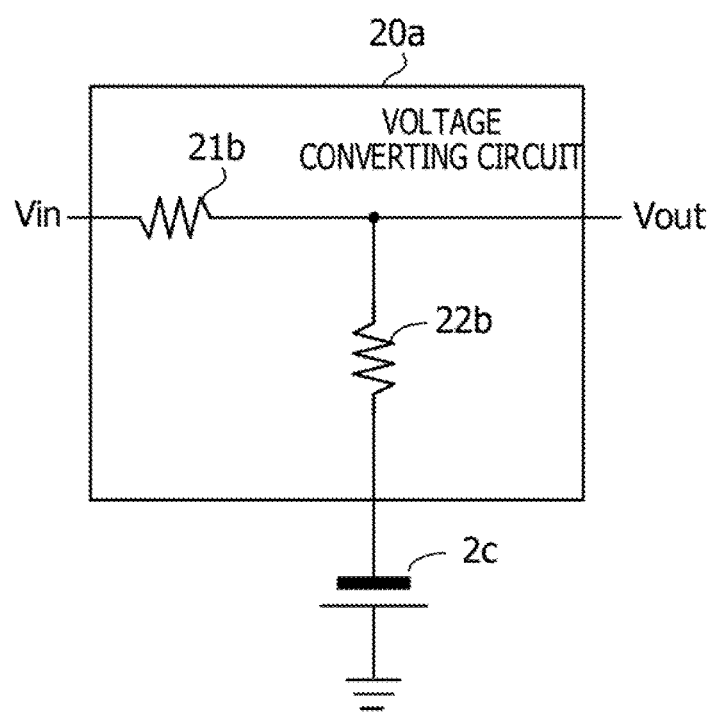
FIG. 3 is a diagram illustrating an example of a voltage converting circuit (resistance division type)

FIG. 3 is a diagram illustrating an example of a voltage converting circuit. A voltage converting circuit 20a represents a case where the voltage converting circuit 20 illustrated in FIG. 2 is a circuit of a resistance division type. The voltage converting circuit 20a includes resistance elements 21b and 22b. An input voltage Vin is applied to one terminal of the resistance element 21b. One terminal of the resistance element 22b is coupled to another terminal of the resistance element 21b. Another terminal of the resistance element 22b is coupled to a negative power supply 2c. In addition, a voltage Vout is output through a point of coupling between the resistance elements 21b and 22b.

The input voltage Vin as a positive pulse voltage is applied to the voltage converting circuit 20a. The voltage converting circuit 20a converts the voltage Vin to a given voltage Vout by resistance division, and outputs the voltage Vout. In this case, in order to output the voltage Vout as a negative voltage, the pulse voltage is level-shifted to a negative side by adding the negative power supply 2c.

Figure 4:
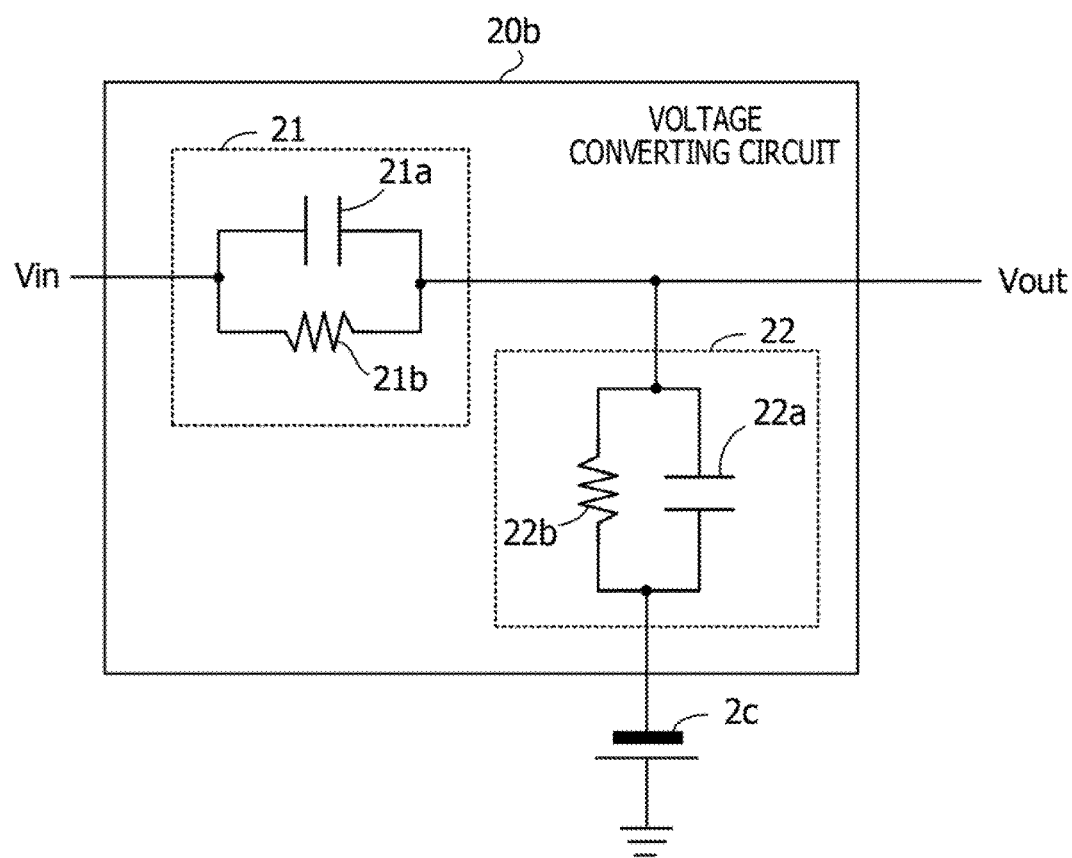
FIG. 4 is a diagram illustrating an example of a voltage converting circuit (waveform shaping type)

FIG. 4 is a diagram illustrating an example of a voltage converting circuit. A voltage converting circuit 20b represents a case where the voltage converting circuit 20 illustrated in FIG. 2 is a circuit of a waveform shaping type. The voltage converting circuit 20b includes parallel circuits 21 and 22. The parallel circuit 21 includes a capacitor 21a and a resistance element 21b. The parallel circuit 22 includes a capacitor 22a and a resistance element 22b.

One terminal of the resistance element 21b is coupled to one terminal of the capacitor 21a. An input voltage Vin is applied to the one terminal of the resistance element 21b and the one terminal of the capacitor 21a. Another terminal of the resistance element 21b is coupled to another terminal of the capacitor 21a, one terminal of the resistance element 22b, and one terminal of the capacitor 22a. Another terminal of the resistance element 22b is coupled to another terminal of the capacitor 22a and a negative power supply 2c. In addition, a voltage Vout is output through a point of coupling between the parallel circuits 21 and 22.

The input voltage Vin as a positive pulse voltage is applied to the voltage converting circuit 20b. The voltage converting circuit 20b converts the input voltage Vin to a given voltage Vout by waveform shaping, and outputs the voltage Vout. In this case, in order to output the voltage Vout as a negative voltage, the pulse voltage is level-shifted to a negative side by adding the negative power supply 2c.

Figure 5:
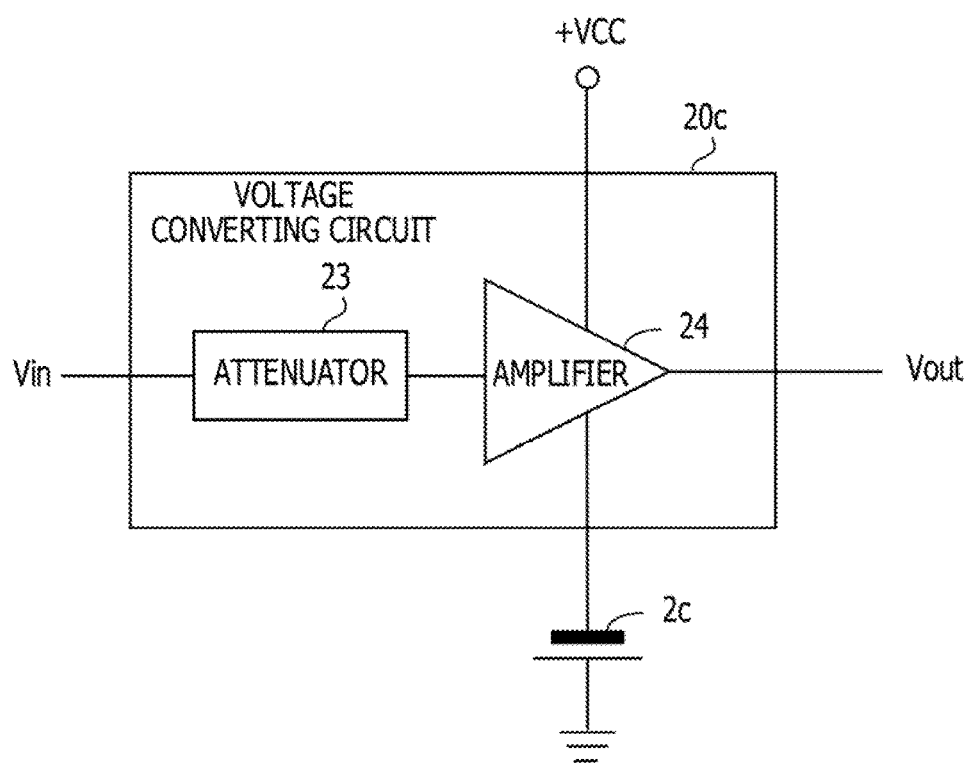
FIG. 5 is a diagram illustrating an example of a voltage converting circuit (dedicated driver)

FIG. 5 is a diagram illustrating an example of a voltage converting circuit. A voltage converting circuit 20c represents a case where a dedicated driver is used in the voltage converting circuit 20 illustrated in FIG. 2. The voltage converting circuit 20c includes an attenuator 23 and an amplifier 24 as the dedicated driver. External power supply voltages (+VCC and −VCC) are applied to the amplifier 24. In addition, there is a limitation in the input voltage in the voltage converting circuit 20c using the dedicated driver, and therefore the attenuator 23 attenuates the level of the input voltage Vin to a certain level. The amplifier 24 amplifies the voltage output from the attenuator 23 to a given level, and outputs the amplified voltage.

The voltage converting circuit 20c converts the input voltage Vin as a positive pulse voltage to a given voltage Vout by the dedicated driver, and outputs the voltage Vout. However, in order to output the voltage Vout as a negative voltage, the pulse voltage is level-shifted to a negative side by adding the negative power supply 2c.

As described above, each of the voltage converting circuit 20a (the resistance division type in FIG. 3), the voltage converting circuit 20b (the waveform shaping type in FIG. 4), and the voltage converting circuit 20c (the dedicated driver in FIG. 5) needs the negative power supply 2c to generate a negative voltage. Therefore, a circuit scale is increased.

On the other hand, the waveform shaping circuit 10-1 according to the first embodiment may generate a negative voltage without using a negative power supply. Reasons therefor will be described in the following.

Figure 6:
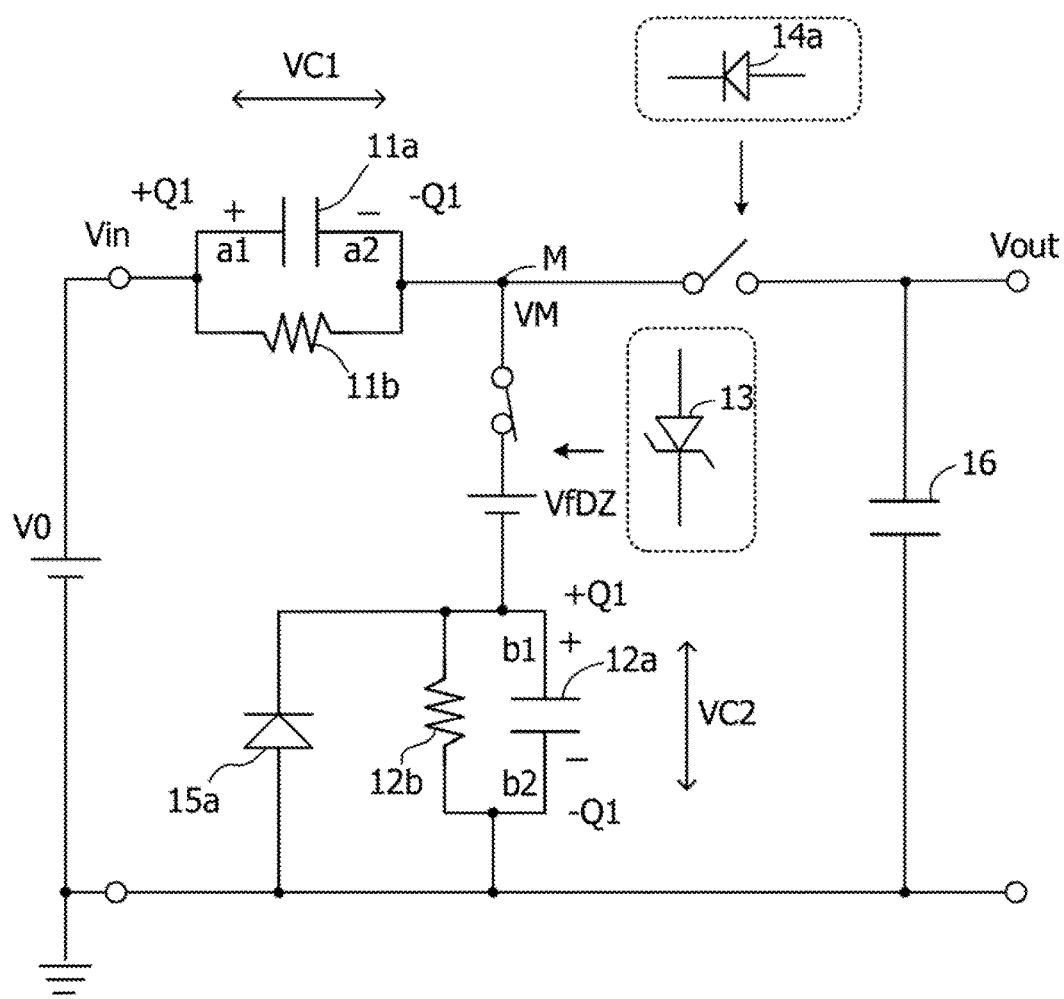
FIG. 6 is a diagram illustrating an example of an equivalent circuit of a waveform shaping circuit.
Figure 7:
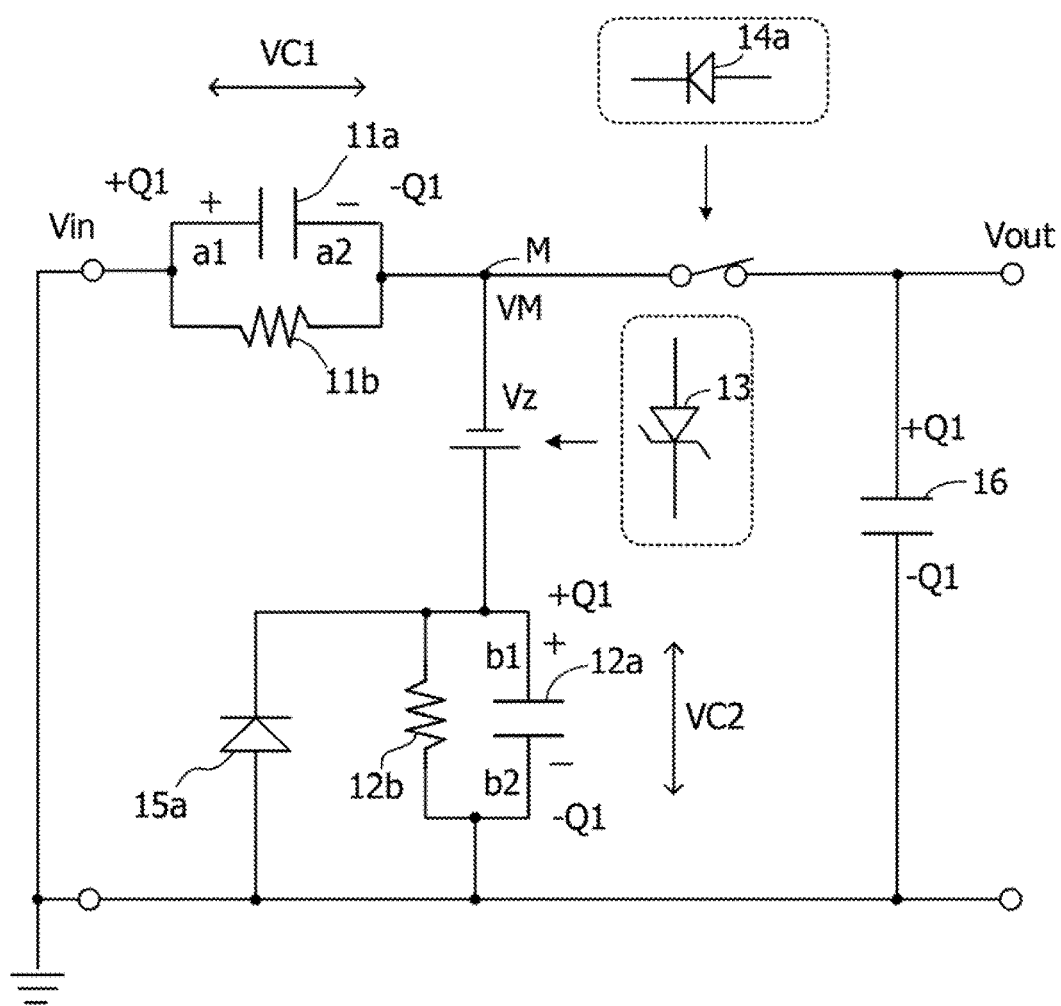
FIG. 7 is a diagram illustrating an example of an equivalent circuit of a waveform shaping circuit.

FIG. 6 and FIG. 7 are diagrams illustrating an example of an equivalent circuit of a waveform shaping circuit.

In FIG. 6, when the input voltage Vin as a positive pulse signal is a positive voltage V0, and when an on time (pulse width) of the pulse signal is a time sufficiently smaller than each CR time constant, a potential VM of a node M in FIG. 6 is expressed by the following Equation (1).

$$VM = C1/(C1+C2)V0 \quad (1)$$

where C1 is the capacitance of the capacitor 11a, and C2 is the capacitance of the capacitor 12a.

In addition, because VM>Vout at this time, and the diode 14a is in a state equivalent to an insulating state, the node M and the output terminal may be considered to be disconnected from each other. On the other hand, when the potential VM is higher than the on (forward) voltage of the Zener diode 13, the Zener diode 13 may be considered to be in a conducting state. A voltage VfDZ in FIG. 6 is the on voltage of the Zener diode 13.

In addition, as illustrated in FIG. 6, a positive charge is induced on a terminal a1 side to which the voltage V0 is applied in the capacitor 11a, a negative charge is induced on a terminal a2 side in the capacitor 11a, a negative charge is induced on a terminal b2 side coupled to the GND in the capacitor 12a, and a positive charge is induced on a terminal b1 side in the capacitor 12a. At this time, a voltage VC1 across the capacitor 11a and a voltage VC2 across the capacitor 12a may be expressed by the following Equations (2a) and (2b).

$$VC1 = Q1/C1 \quad (2a)$$

$$VC2 = Q1/C2 \quad (2b)$$

where Q1 is an amount of charge stored in the capacitors 11a and 12a. Incidentally, in a case where the diode 15a is a Zener diode, the Zener diode acts such that the voltage VC2 does not exceed a Zener voltage.

Next, when the input voltage Vin becomes 0 V, as illustrated in FIG. 7, the terminal a1 side of the capacitor 11a becomes 0 V, and therefore the potential VM of the node M becomes negative. When the potential VM of the node M is equal to or higher than a Zener voltage BV (negative voltage) of the Zener diode 13, the Zener diode 13 is in an insulating state, and the charge of Q1 is stored in the capacitor 11a.

However, because the resistance element 12b is coupled in parallel with the capacitor 12a, the charge decreases with a time constant of C2R2 of the capacitance C2 of the capacitor 12a and a resistance value R2 of the resistance element 12b.

When the potential VM of the node M becomes equal to or lower than the Zener voltage BV, the Zener voltage BV is applied in series, and the potential VM of the node M becomes a sum of the Zener voltage BV and the voltage across the capacitor 12a. Meanwhile, because the potential VM of the node M is negative, the diode 14a is in a conducting state. Then, a positive charge +Q1 is induced in a capacitor 16 (load capacitance) by the negative charge −Q1 stored in the capacitor 11a, and the potential of the output terminal becomes substantially equal to the potential VM (negative potential) of the node M.

Here, letting Vf be the forward voltage of the diode 14a, the output voltage Vout of the waveform shaping circuit 10-1 may be expressed by the following Equation (3).

$$Vout = BV + Vf + VC2 \quad (3)$$

However, the above Equation (3) holds when |VC1| is higher than |BV+VC2| immediately before the pulse voltage input to the input terminal switches from a positive value to 0 V.

As described above, the waveform shaping circuit 10-1 according to the first embodiment may output a negative voltage from the output terminal when a positive pulse voltage is applied to the input terminal. Therefore, the addition of a negative power supply (external power supply) becomes unnecessary, so that a circuit scale may be reduced.

(Simulation Example)

Figure 8:
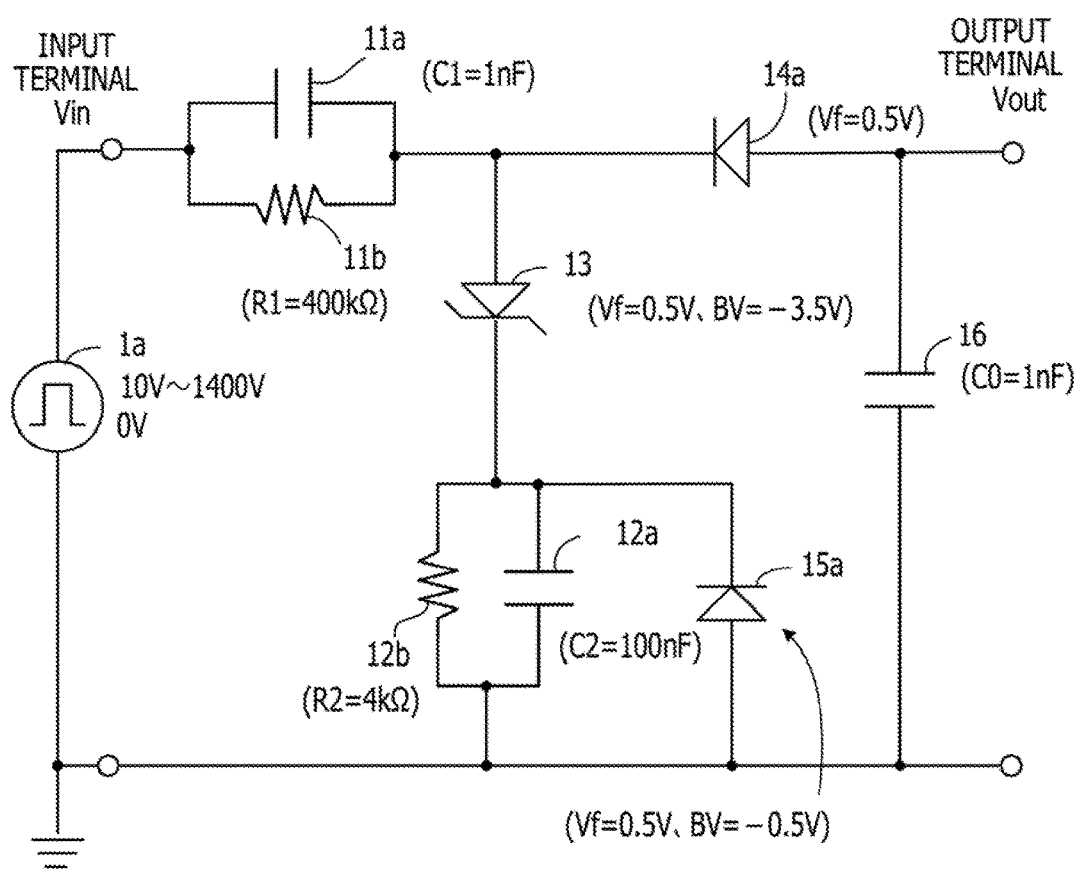
FIG. 8 is a diagram illustrating an example of values of respective elements of a waveform shaping circuit used for simulation.

FIG. 8 is a diagram illustrating an example of values of respective elements of a waveform shaping circuit used for simulation. A pulse oscillating source 1a that outputs a positive pulse voltage of 10 to 1400 V is coupled to the input terminal of the waveform shaping circuit 10-1. A capacitor 16 is coupled as a load capacitance to the output terminal of the waveform shaping circuit 10-1. Another terminal of the capacitor 16 is coupled to the GND. The other coupling relation is the same as in FIG. 1.

Suppose that, as an example of the values of respective circuit elements, a capacitance C1 of the capacitor 11a is 1 nF, a resistance value R1 of the resistance element 11b is 400 kΩ, a capacitance C2 of the capacitor 12a is 100 nF, and a resistance value R2 of the resistance element 12b is 4 kΩ. Suppose that a capacitance C0 of the capacitor 16 is 1 nF.

In addition, suppose that a forward voltage Vf of the Zener diode 13 is 0.5 V, and a Zener voltage BV of the Zener diode 13 is −3.5 V. In addition, suppose that a Zener diode is used as the diode 15a, and that a forward voltage Vf of the Zener diode used as the diode 15a is 0.5 V and a Zener voltage BV of the Zener diode used as the diode 15a is −0.5 V. Suppose that a forward voltage Vf of the diode 14a is 0.5 V.

Figure 9:
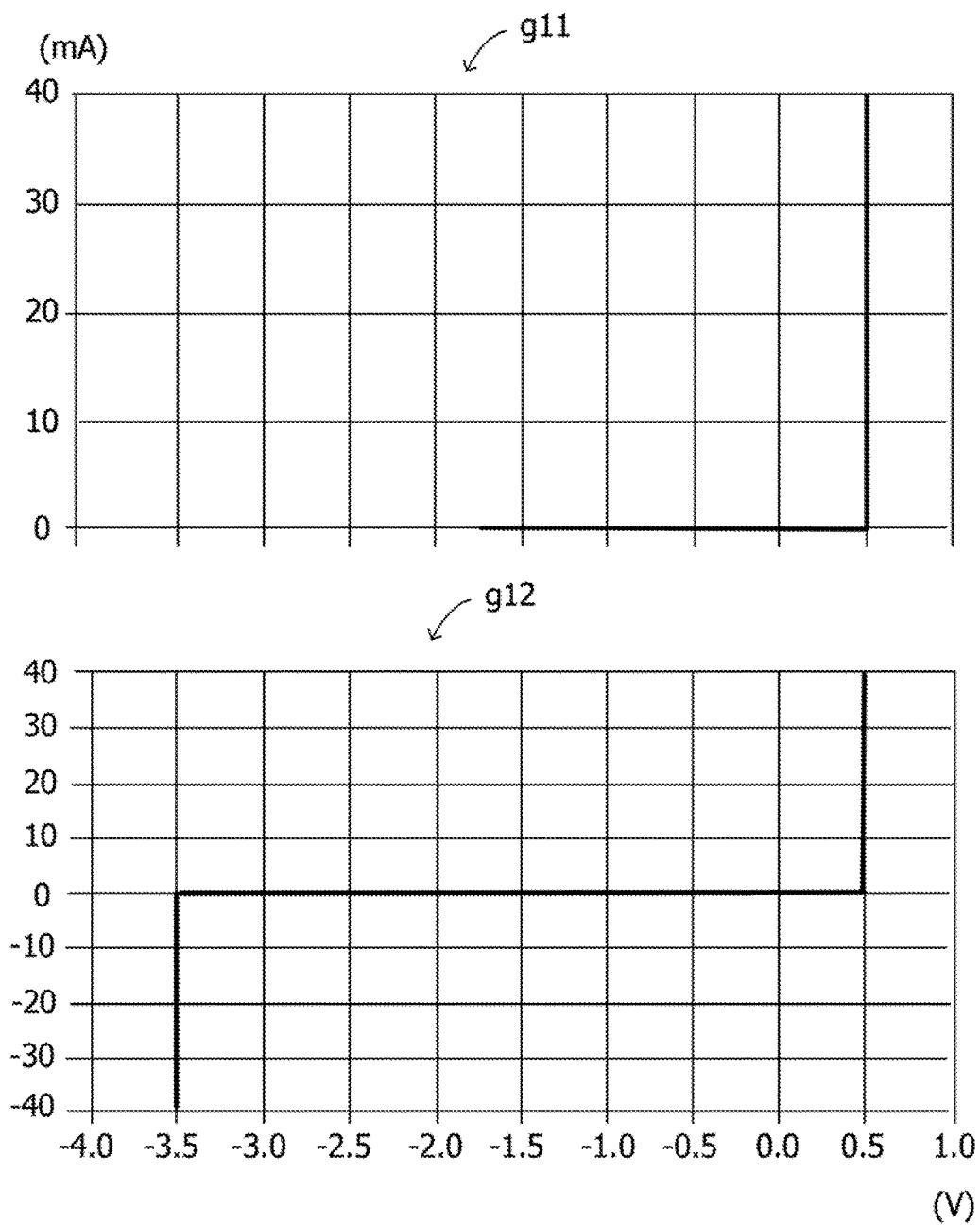
FIG. 9 is a diagram illustrating an example of characteristics of a diode and a Zener diode.

FIG. 9 is a diagram illustrating an example of characteristics of a diode and a Zener diode. A graph g11 illustrates characteristics of the diode 14a. In the graph g11, an axis of ordinates indicates current (mA), and an axis of abscissas Indicates voltage (V). A graph g12 illustrates characteristics of the Zener diode 13. In the graph g12, an axis of ordinates indicates current (mA), and an axis of abscissas indicates voltage (V).

In the graph g11, when the forward voltage of the diode 14a reaches 0.5 V, a current flows in the forward direction of the diode 14a. In addition, in the graph g12, when the forward voltage of the Zener diode 13 reaches 0.5 V, a current flows in the forward direction of the Zener diode 13, and when the Zener voltage reaches −3.5 V, a current flows in the reverse direction of the Zener diode 13.

Figure 10:
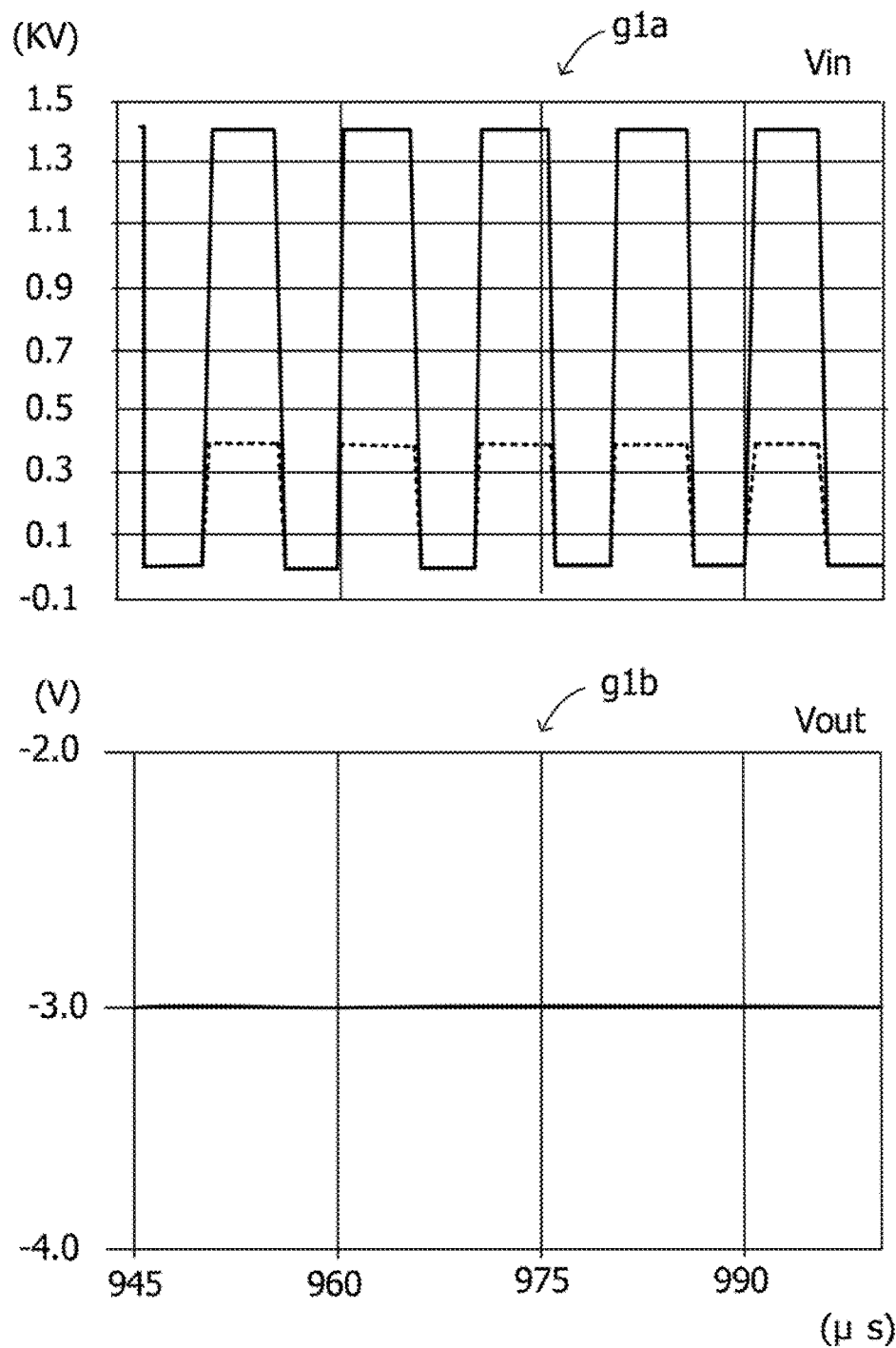
FIG. 10 is a diagram Illustrating an example of a simulation result.

FIG. 10 is a diagram illustrating an example of a simulation result.

A waveform graph g1a represents the waveform of the input voltage Vin. In the waveform graph g1a, an axis of abscissas indicates time (μs), and an axis of ordinates indicates the input voltage Vin (KV). A waveform graph g1b represents the waveform of the output voltage Vout. In the waveform graph g1b, an axis of abscissas indicates time (μs), and an axis of ordinates Indicates the output voltage Vout (V).

When the input voltage Vin having a positive side peak value of 1.4 KV is input to the waveform shaping circuit 10-1, the waveform of the output voltage Vout is in the vicinity of −3.0 V. In addition, when the pulsed input voltage Vin having a positive side peak value of 0.4 KV is input to the waveform shaping circuit 10-1, the waveform of the output voltage Vout is in the vicinity of −3.0 V. Thus, it is clear that the output voltage Vout is a fixed negative voltage with respect to the change in the peak value of the positive pulse voltage, and that a stable negative voltage not following input variations may therefore be generated without the use of a negative power supply.

Such a waveform shaping circuit 10-1 may be applied to a differential amplifying device as follows, for example.

Figure 11:
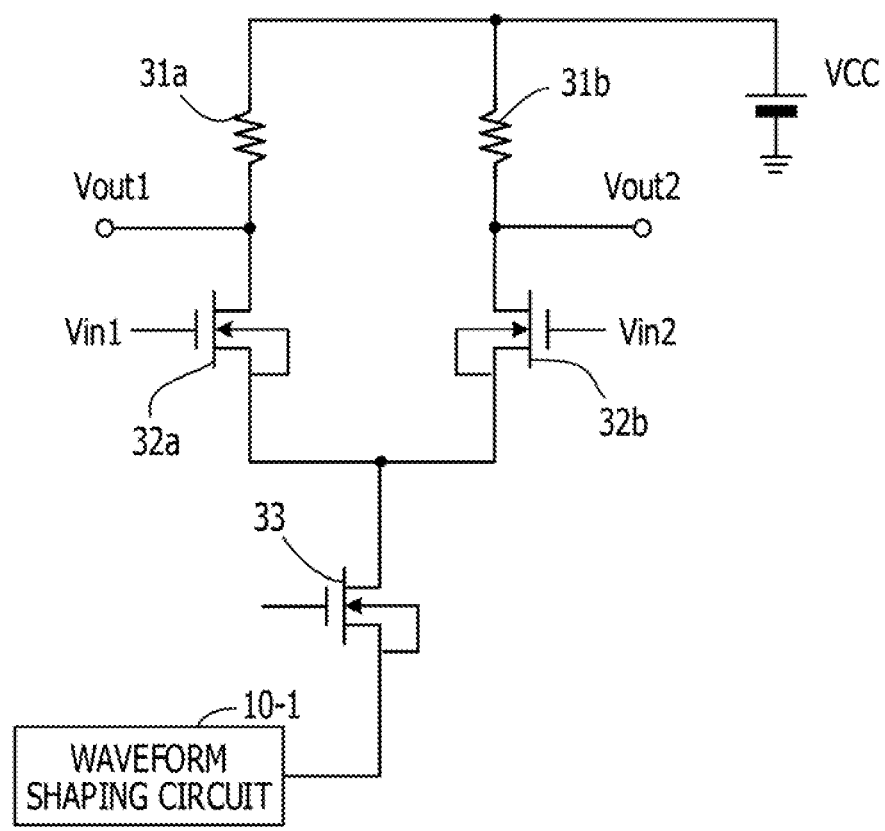
FIG. 11 is a diagram Illustrating an example of a differential amplifying device.

FIG. 11 is a diagram illustrating an example of a differential amplifying device. A differential amplifying device 30 is illustrated as an example of a semiconductor device to which the waveform shaping circuit 10-1 described above is applied. The differential amplifying device 30 includes resistance elements 31a and 31b, transistors 32a, 32b, and 33, and the waveform shaping circuit 10-1. The transistors 32a, 32b, and 33 are an n-channel MOSFET.

In coupling relation of each circuit element, one terminals of the resistance element 31a and the resistance element 31b are coupled to a positive side terminal of a power supply VCC. Another terminal of the resistance element 31a is coupled to an output terminal from which a voltage Vout1 is output and a drain terminal of the transistor 32a. Another terminal of the resistance element 31b is coupled to an output terminal from which a voltage Vout2 is output and a drain terminal of the transistor 32b.

Source terminals of the transistors 32a and 32b are coupled to a drain terminal of the transistor 33. The output terminal of the waveform shaping circuit 10-1 is electrically coupled to a source terminal of the transistor 33. The output terminal of the waveform shaping circuit 10-1 does not have to be coupled directly to the source terminal of the transistor 33, but may, for example, be coupled to the source terminal of the transistor 33 via a resistance or the like.

An input terminal to which a voltage Vin1 is input is coupled to a gate terminal of the transistor 32a. An input terminal to which a voltage Vin2 is input is coupled to a gate terminal of the transistor 32b. In addition, a control voltage output from a control circuit not illustrated is input to a gate terminal of the transistor 33.

A stable negative voltage may be supplied to the source terminal of the transistor 33 by applying the waveform shaping circuit 10-1 to such a differential amplifying device 30.

Second Embodiment

Figure 12:
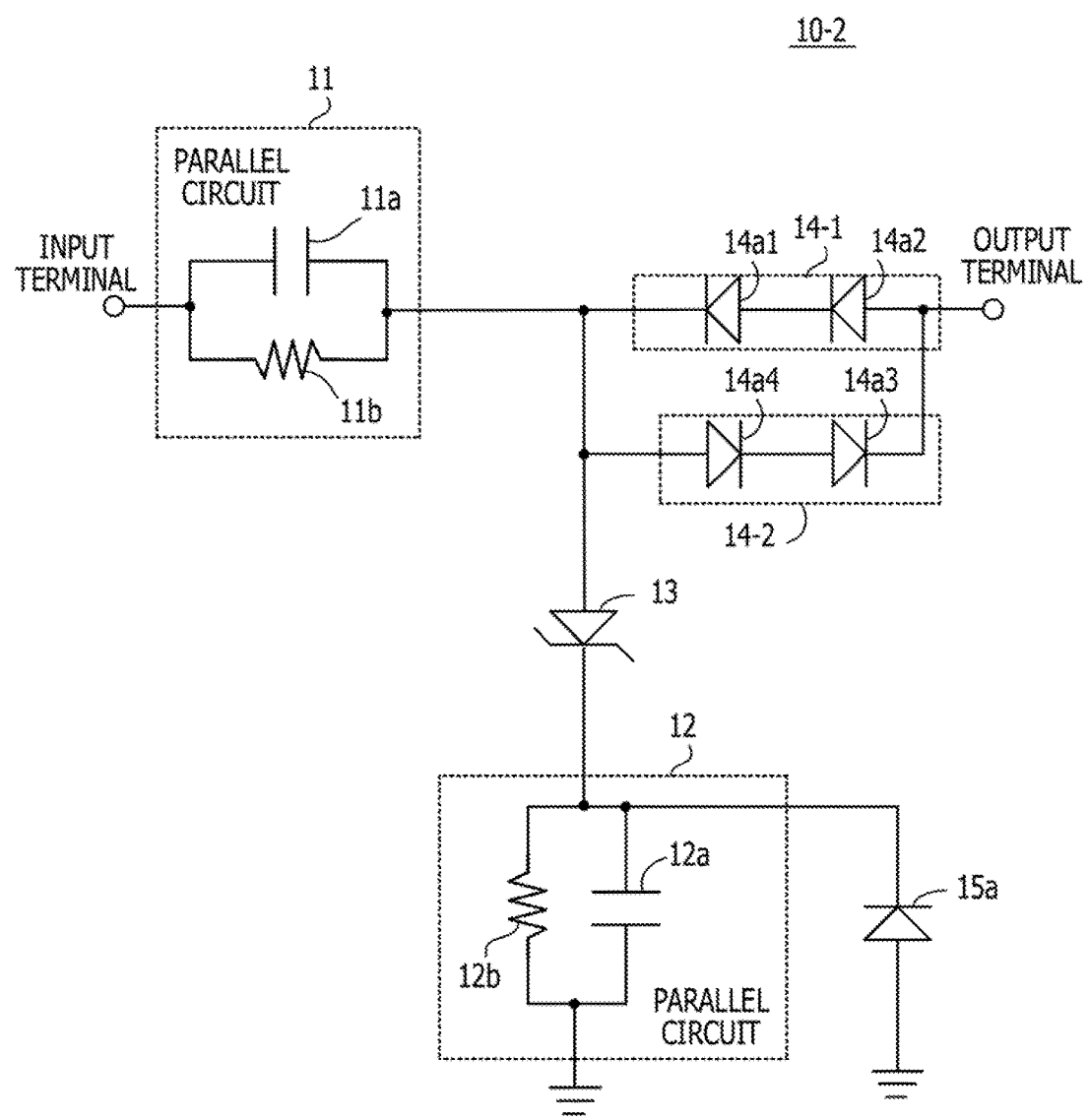
FIG. 12 is a diagram illustrating an example of a waveform shaping circuit according to a second embodiment.

FIG. 12 is a diagram illustrating an example of a waveform shaping circuit according to a second embodiment. In FIG. 12, the same elements as in the waveform shaping circuit 10-1 according to the first embodiment illustrated in FIG. 1 are identified by the same reference numerals. A waveform shaping circuit 10-2 includes rectifier circuits 14-1 and 14-2.

The rectifier circuit 14-1 has functions similar to those of the rectifier circuit 14 of the waveform shaping circuit 10-1 according to the first embodiment. For example, the rectifier circuit 14-1 interrupts a current flowing in a direction from the parallel circuit 11 side to the output terminal. On the other hand, as opposed to the rectifier circuit 14-1, the rectifier circuit 14-2 coupled in parallel with the rectifier circuit 14-1 interrupts a current flowing from the output terminal to the parallel circuit 11 side. In the example of FIG. 12, the rectifier circuit 14-1 includes diodes 14a1 and 14a2 coupled in series with each other, and the rectifier circuit 14-2 includes diodes 14a3 and 14a4 coupled in series with each other. Incidentally, the rectifier circuits 14-1 and 14-2 may each be one diode, or may each be a circuit in which three or more diodes are coupled in series with each other.

Even though such a waveform shaping circuit 10-2 does not have a negative power supply, the waveform shaping circuit 10-2 provides a negative pulse voltage from the output terminal when a positive pulse voltage is applied to the input terminal. In the following, by taking as an example a semiconductor device including a FET driven by a negative pulse voltage output by the waveform shaping circuit 10-2, description will be made of an example of operation of the waveform shaping circuit 10-2 and reasons that a negative pulse voltage is obtained.

Figure 13:
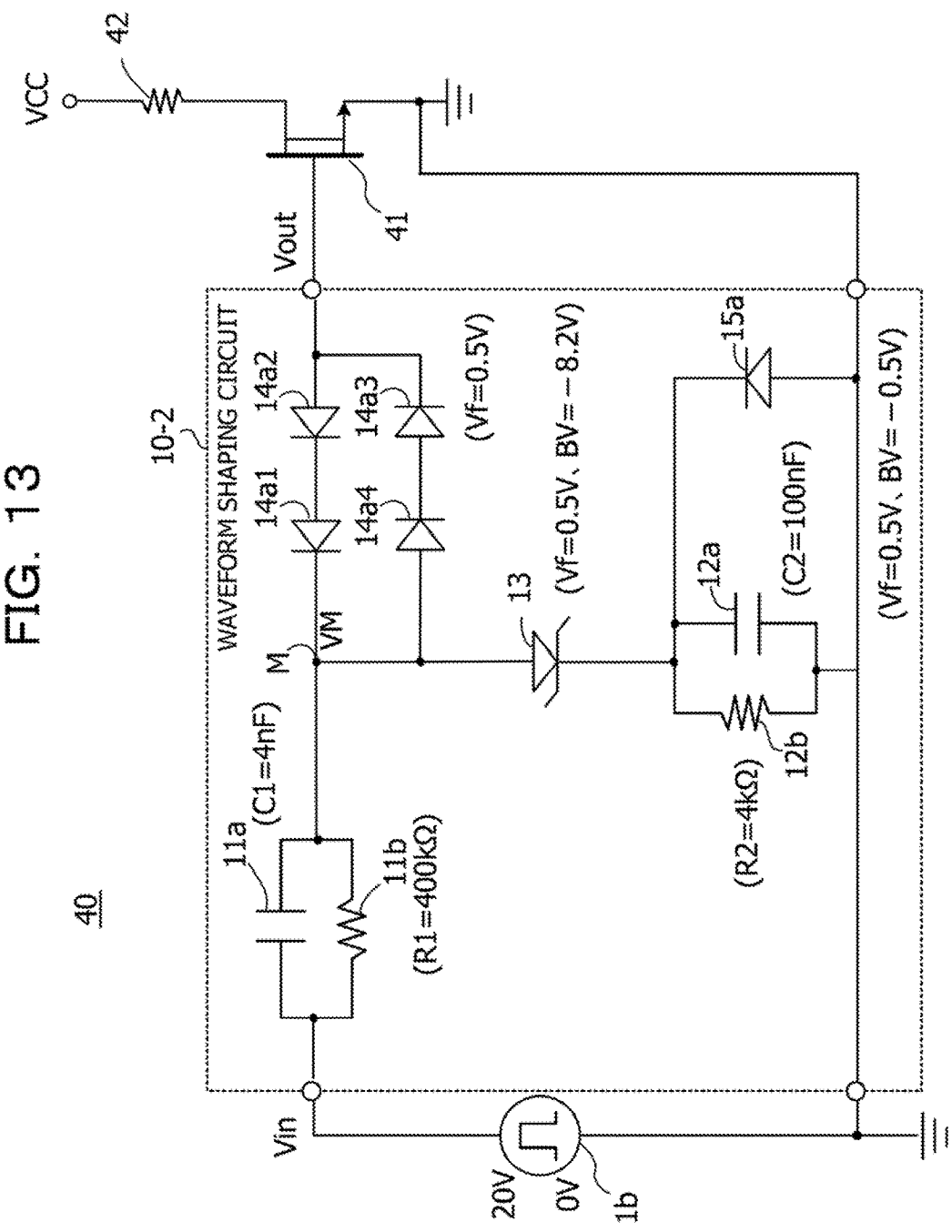
FIG. 13 is a diagram of assistance in explaining an example of a semiconductor device.

FIG. 13 is a diagram illustrating an example of a semiconductor device.

A semiconductor device 40 includes a transistor 41, a resistance element 42, and the waveform shaping circuit 10-2. The transistor 41 is an n-channel MOSFET, and is, for example, a normally on type GaN-HEMT.

A power VCC is applied to one terminal of the resistance element 42. Another terminal of the resistance element 42 is coupled to a drain terminal of the transistor 41. A source terminal of the transistor 41 is coupled to a GND. A gate terminal of the transistor 41 is electrically coupled to the output terminal of the waveform shaping circuit 10-2. Incidentally, the output terminal of the waveform shaping circuit 10-2 does not have to be coupled directly to the gate terminal, but may, for example, be coupled to the gate terminal via a resistance or the like. A similar is true also for each application example to be illustrated in the following.

FIG. 13 illustrates an example of parameters of circuit elements of the waveform shaping circuit 10-2.

One terminal of a pulse oscillating source 1b that outputs a positive pulse voltage of 0 to 20 V is coupled to one input terminal of the waveform shaping circuit 10-2. Another terminal of the pulse oscillating source 1b is coupled to the other input terminal of the waveform shaping circuit 10-2 and the GND. In addition, the gate terminal of the transistor 41 is coupled to an anode of the diode 14a2 and a cathode of the diode 14a3.

Suppose that, as concrete values of circuit elements, a capacitance C1 of the capacitor 11a is 4 nF, a resistance value R1 of the resistance element 11b is 400 kΩ, a capacitance C2 of the capacitor 12a is 100 nF, and a resistance value R2 of the resistance element 12b is 4 kΩ. In addition, suppose that a forward voltage Vf of the Zener diode 13 is 0.5 V, and a Zener voltage BV of the Zener diode 13 is −8.2 V. Suppose that a forward voltage Vf of the Zener diode 13 is 0.5 V, and a Zener voltage BV of the Zener diode 13 is −0.5 V. Further, suppose that a forward voltage Vf of the diodes 14a1, 14a2, 14a3, and 14a4 is 0.5 V.

Here, as for the potential of the node M, when the pulse voltage is a positive value (20 V), the potential VM of the node M is determined by the forward voltage Vf of the Zener diode 13 and the voltage VC2 across the capacitor 12a, and the potential VM of the node M is Equation (4).

$$VM = Vf + VC2 \quad (4)$$

When a potential difference between the potential VM and the output voltage Vout exceeds a sum of the forward voltage Vf of the diode 14a3 and the forward voltage Vf of the diode 14a4 (the sum is 1 V in this case), the diodes 14a3 and 14a4 are set in an on state, and the output voltage Vout becomes VM−2Vf. Incidentally, because VM=1 V and 2Vf=1 V, Vout=0 V.

When the pulse voltage is 0 V, and when |VC1|>|BV+VC2|, the potential VM of the node M is Equation (5).

$$VM = BV + VC2 \quad (5)$$

When VM<Vout and Vout−VM>2Vf, the diodes 14a1 and 14a2 are set in an on state, and the voltage Vout becomes VM+2Vf. Incidentally, because VM=−8.2 V+0.5 V and 2Vf=1 V, Vout=−6.7 V.

Incidentally, the above-described diodes represent a case where ideal diodes are assumed. In actuality, on voltages are determined by currents flowing through the respective diodes and the Zener diode. Therefore, the above-described numerical value of −6.7 V is an approximate value, and is actually a value in the neighborhood of the above-described numerical value. As a result of such operation, the output voltage Vout is a pulse voltage in a range of 0 to −6.7 V.

Figure 14:
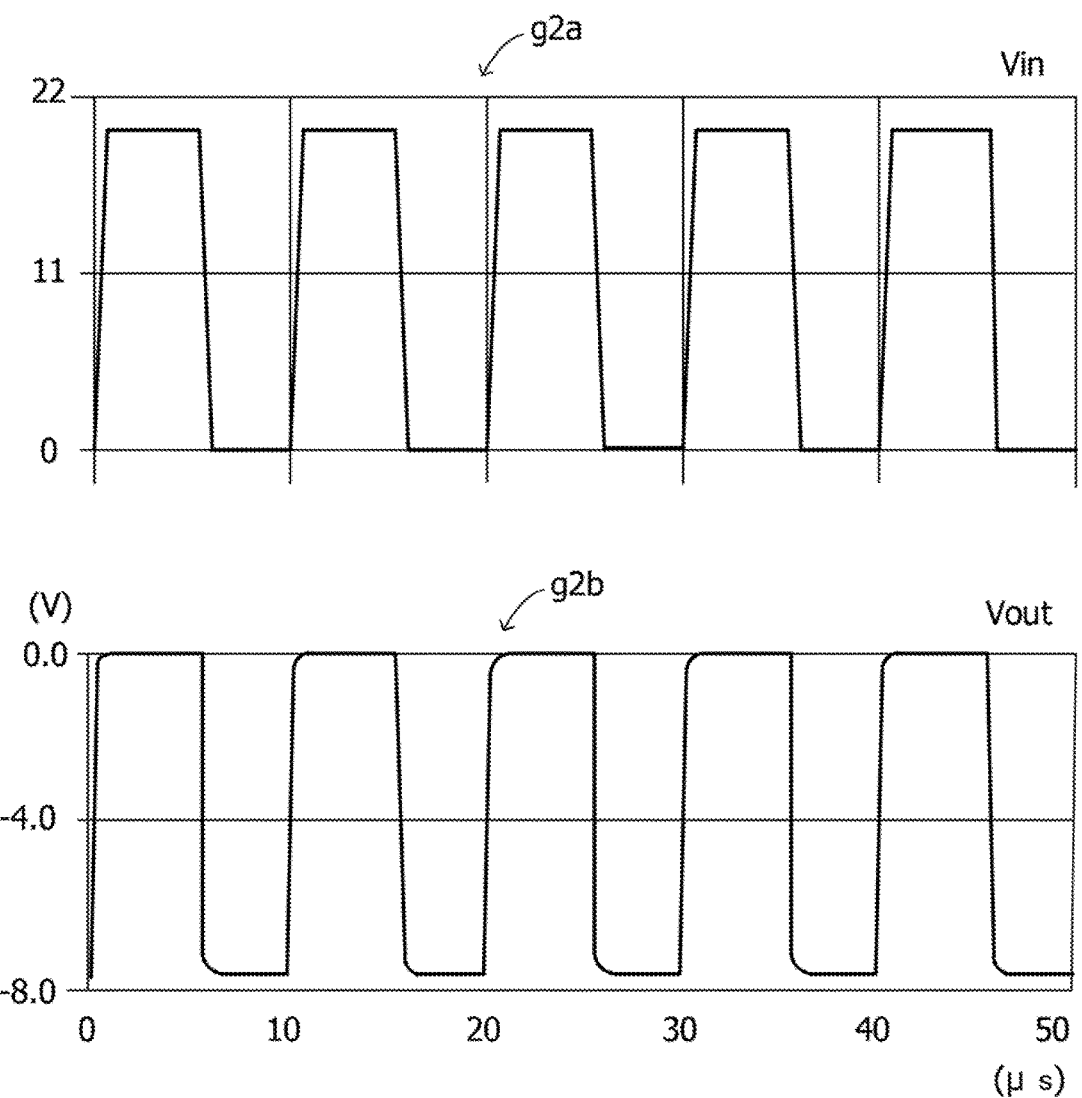
FIG. 14 is a diagram illustrating an example of a simulation result.

FIG. 14 is a diagram illustrating an example of a simulation result. FIG. 14 illustrates a simulation result when a simulation was performed with the values of the circuit elements illustrated in FIG. 13.

A waveform graph g2a represents the waveform of the input voltage Vin. In the waveform graph g2a, an axis of abscissas indicates time (μs), and an axis of ordinates indicates the input voltage Vin (V). A waveform graph g2b represents the waveform of the output voltage Vout. In the waveform graph g2b, an axis of abscissas indicates time (μs), and an axis of ordinates indicates the output voltage Vout (V).

When the input voltage Vin as a pulse voltage having a positive side peak value of 20 V is input to the waveform shaping circuit 10-2, the waveform of the output voltage Vout is a pulse waveform in a range of close to −7.0 to 0.0 V.

Thus, the waveform shaping circuit 10-2 according to the second embodiment is able to output a negative pulse voltage by further including the rectifier circuit 14-2.

(Example of Application to Switch Power Supply Device)

Figure 15:
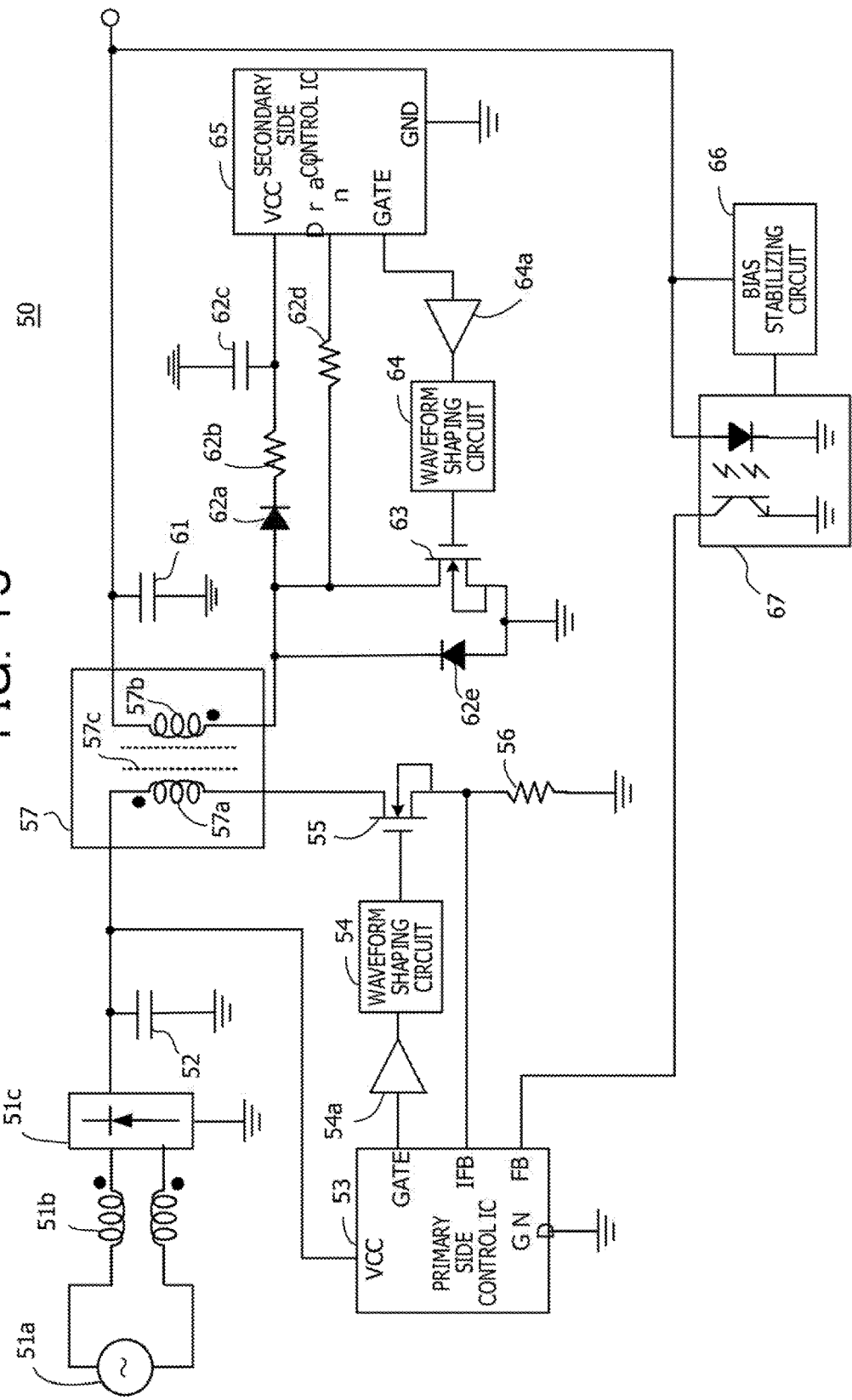
FIG. 15 is a diagram illustrating an example of a switching power supply device.

FIG. 15 is a diagram illustrating an example of a switching power supply device. A switching power supply device 50 is illustrated as an example of a semiconductor device to which the waveform shaping circuit 10-2 described above is applied.

A primary side circuit unit of the switching power supply device 50 includes a common mode filter 51b, a diode bridge 51c, a capacitor 52, a primary side control IC 53, an amplifier 54a, a waveform shaping circuit 54, a transistor 55, and a resistance element 56.

In addition, the switching power supply device 50 includes a transformer 57 that electrically insulates the primary side circuit unit and a secondary side circuit unit from each other and magnetically couples the primary side circuit unit and the secondary side circuit unit to each other.

The secondary side circuit unit includes capacitors 61 and 62c, resistance elements 62b and 62d, diodes 62a and 62e, a transistor 63, an amplifier 64a, a waveform shaping circuit 64, and a secondary side control IC 65. The switching power supply device 50 further includes a bias stabilizing circuit 66 and a photocoupler 67. Incidentally, the transistors 55 and 63 are an n-channel MOSFET, and are, for example, a normally on type GaN-HEMT.

The common mode filter 51b is coupled to an alternating-current power supply 51a, and filters out a harmonic noise from an alternating-current voltage. The diode bridge 51c rectifies the alternating-current voltage after the noise removal, and outputs a rectified signal. The capacitor 52 smoothes the rectified signal output by the diode bridge 51c.

When a power supply voltage reaches an operable voltage, the primary side control IC 53 outputs a control voltage (control signal) for controlling switching operation of the transistor 55. In addition, the primary side control IC 53 includes at least a VCC terminal, a GATE terminal, an IFB terminal, an FB terminal, and a GND terminal.

The VCC terminal is a terminal from which the power supply voltage is supplied to the primary side control IC 53. The VCC terminal is coupled with one terminal of the capacitor 52, an output terminal of the diode bridge 51c, and one terminal of a primary winding 57a of the transformer 57. Another terminal of the capacitor 52 is coupled to a GND.

The GATE terminal is a terminal from which the control voltage for switching the transistor 55 is output. The GATE terminal is coupled to an input terminal of the amplifier 54a.

The IFB terminal is a terminal for performing feedback detection of a current flowing from a drain terminal to a source terminal of the transistor 55. The IFB terminal is coupled to the source terminal of the transistor 55 and one terminal of the resistance element 56. Another terminal of the resistance element 56 is coupled to the GND. Incidentally, when the current input to the IFB terminal is an abnormal value, the primary side control IC 53, for example, stops the switching operation of the transistor 55 by setting the control voltage output from the GATE terminal to a given level.

The FB terminal is a terminal that receives a feedback voltage output from the photocoupler 67. Based on the feedback voltage, the primary side control IC 53 adjusts a duty ratio to an appropriate value so that the output voltage of the device is held uniform. The GND terminal is coupled to the GND.

The amplifier 54a amplifies the control voltage output from the primary side control IC 53, and outputs the control voltage after the amplification. When the waveform shaping circuit 54 receives the control voltage after the amplification, the waveform shaping circuit 54 converts the control voltage into a desired operating voltage range of the transistor 55, and outputs a voltage signal after the conversion as a gate voltage. The waveform shaping circuit 10-2 described above, for example, is used as the waveform shaping circuit 54.

The transistor 55 includes the drain terminal coupled to the primary winding 57a of the transformer 57, the source terminal coupled to the GND via the resistance element 56, and a gate terminal to which the gate voltage output from the waveform shaping circuit 54 is applied. The transistor 55 is turned on or off according to the gate voltage supplied from the waveform shaping circuit 54.

Incidentally, in a case where the transistor 55 is a normally on type GaN-HEMT, when the waveform shaping circuit 54 turns on the transistor 55, the waveform shaping circuit 54 applies 0 V as an on voltage signal to the gate terminal of the transistor 55. In addition, when the waveform shaping circuit 54 turns off the transistor 55, the waveform shaping circuit 54 applies a negative voltage as an off voltage signal to the gate terminal of the transistor 55.

The transformer 57 includes the primary winding 57a, a secondary winding 57b, and a core 57c. Though schematically Illustrated in FIG. 15, the primary winding 57a and the secondary winding 57b are wound around the core 57c. Incidentally, a black dot illustrated in the vicinity of one terminal of each winding indicates a winding start position of each winding.

The one terminal of the primary winding 57a is coupled to the output terminal of the diode bridge 51c, the one terminal of the capacitor 52, and the VCC terminal of the primary side control IC 53. Another terminal of the primary winding 57a is coupled to the drain terminal of the transistor 55.

One terminal of the secondary winding 57b is coupled to one terminal of the capacitor 61 and an output terminal of the switching power supply device 50. Another terminal of the capacitor 61 is coupled to the GND. The capacitor 61 is provided to reduce a ripple voltage occurring in the output voltage.

Another terminal of the secondary winding 57b is coupled to an anode of the diode 62a, one terminal of the resistance element 62d, a drain terminal of the transistor 63, and a cathode of the diode 62e.

The transistor 63 includes the drain terminal coupled to the one terminal of the secondary winding 57b, a source terminal coupled to the GND, and a gate terminal to which a gate voltage supplied from the waveform shaping circuit 64 is applied. The transistor 63 performs switching operation based on the gate voltage.

The secondary side control IC 65 outputs a control voltage for controlling the switching operation of the transistor 63 based on a drain voltage of the transistor 63. The secondary side control IC 65 includes at least a VCC terminal, a Drain terminal, a GATE terminal, and a GND terminal.

The VCC terminal is a terminal from which a power supply voltage is supplied to the secondary side control IC 65. The VCC terminal is coupled to one terminal of the capacitor 62c and one terminal of the resistance element 62b. Another terminal of the capacitor 62c is coupled to the GND. Another terminal of the resistance element 62b is coupled to a cathode of the diode 62a. The VCC terminal is supplied with the power supply voltage generated by the diode 62a, the resistance element 62b, and the capacitor 62c. The secondary side control IC 65 operates on the power supply voltage.

The Drain terminal is coupled to the one terminal of the secondary winding 57b and the drain terminal of the transistor 63 via the resistance element 62d provided to detect the drain voltage of the transistor 63.

The GATE terminal is coupled with an input terminal of the amplifier 64a. The control voltage is output from the GATE terminal. The GND terminal is coupled with the GND.

The amplifier 64a amplifies the control voltage output from the secondary side control IC 65. When the waveform shaping circuit 64 receives the control voltage after the amplification, the waveform shaping circuit 64 converts the control voltage into a desired operating voltage range of the transistor 63, and outputs a voltage signal after the conversion as a gate voltage. The waveform shaping circuit 10-2 described above, for example, is used as the waveform shaping circuit 64.

Incidentally, in a case where the transistor 63 is a normally on type GaN-HEMT, when the waveform shaping circuit 64 turns on the transistor 63, the waveform shaping circuit 64 applies 0 V as an on voltage signal to the gate terminal of the transistor 63. In addition, when the waveform shaping circuit 64 turns off the transistor 63, the waveform shaping circuit 64 applies a negative voltage as an off voltage signal to the gate terminal of the transistor 63.

The diode 62e has a function of performing rectification during a period before a start of synchronous rectification by the switching operation of the transistor 63. An anode of the diode 62e is coupled to the source terminal of the transistor 63 and the GND. The cathode of the diode 62e is coupled to the drain terminal of the transistor 63.

The diode 62a, the resistance element 62b, and the capacitor 62c generate a power supply voltage, which is a direct-current voltage for operating the secondary side control IC 65. The anode of the diode 62a is coupled to the one terminal of the secondary winding 57b. The cathode of the diode 62a is coupled to the one terminal of the resistance element 62b. The other terminal of the resistance element 62b is coupled to the one terminal of the capacitor 62c and the VCC terminal of the secondary side control IC 65.

The bias stabilizing circuit 66 stabilizes the bias of the output voltage, and generates a signal based on the Input level of the photocoupler 67. The photocoupler 67 outputs the output signal from the bias stabilizing circuit 66 as an error signal indicating an error between the output voltage (direct-current voltage) of the switching power supply device 50 and an expected value thereof. The primary side control IC 53 receives the error signal as the feedback voltage of the output voltage, and adjusts the duty ratio to an appropriate value.

Examples of application to other semiconductor devices will be described in the following.

(Example of Application to PFC Device)

Figure 16:
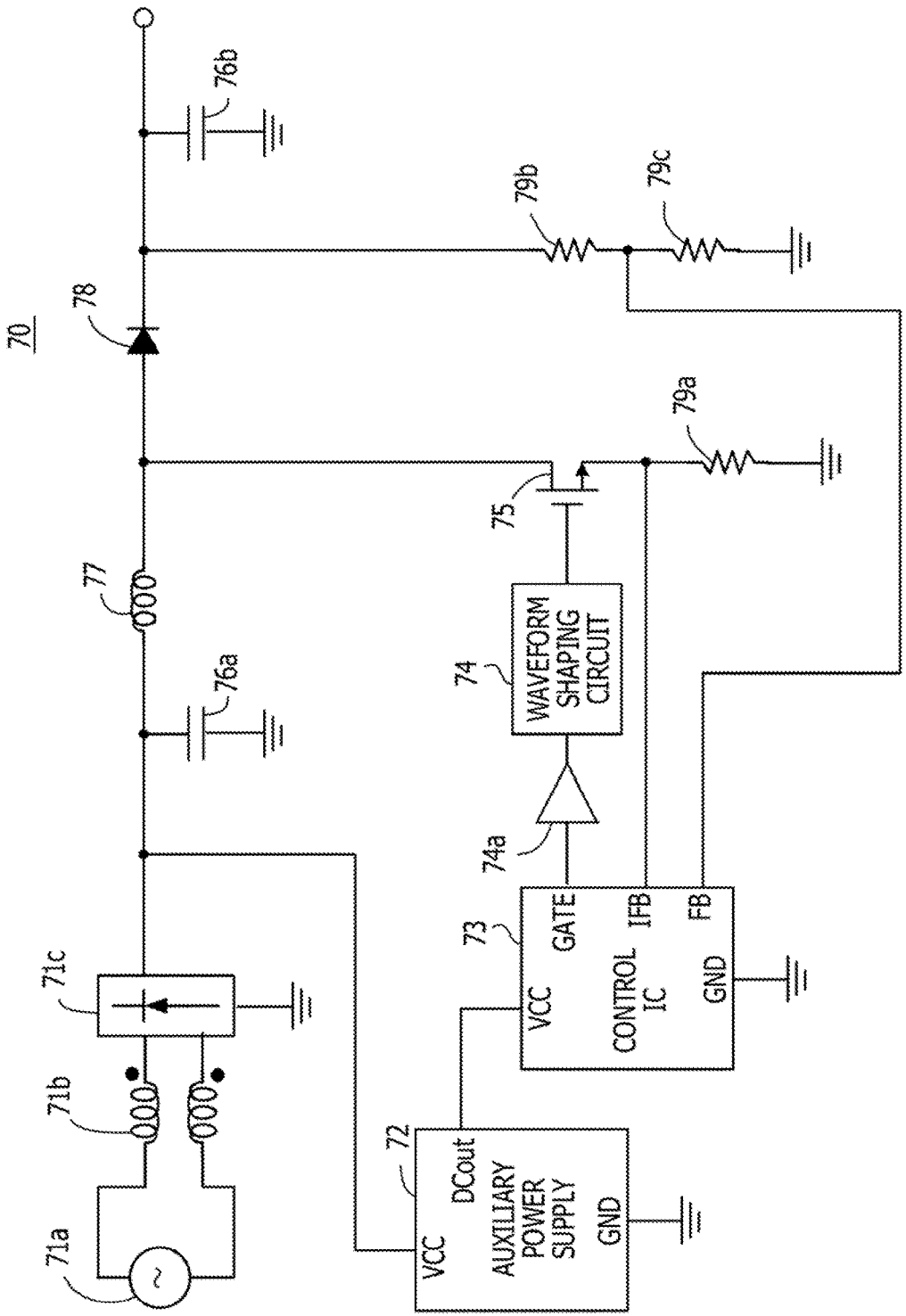
FIG. 16 is a diagram illustrating an example of a power factor correction (PFC) device.

FIG. 16 is a diagram illustrating an example of a PFC device. A PFC (power factor improvement) device 70 improves a power factor by suppressing harmonics from an alternating-current power supply 71a. The PFC device 70 includes a common mode filter 71b, a diode bridge 71c, an auxiliary power supply 72, a control IC 73, an amplifier 74a, a waveform shaping circuit 74, a transistor 75, capacitors 76a and 76b, an inductor 77, a diode 78, and resistance elements 79a, 79b, and 79c. The transistor 75 is an n-channel type MOSFET, and is, for example, a normally on type GaN-HEMT.

In coupling relation of each circuit element, the alternating-current power supply 71a is coupled to an input side of the common mode filter 71b. An input terminal of the diode bridge 71c is coupled to an output side of the common mode filter 71b. An output terminal of the diode bridge 71c is coupled with a VCC terminal of the auxiliary power supply 72, one terminal of the capacitor 76a, and one terminal of the inductor 77. Another terminal of the capacitor 76a is coupled to a GND.

Another terminal of the inductor 77 is coupled to a drain terminal of the transistor 75 and an anode of the diode 78. A cathode of the diode 78 is coupled to one terminal of the resistance element 79b, one terminal of the capacitor 76b, and an output terminal. Another terminal of the capacitor 76b is coupled to the GND.

A DCout terminal of the auxiliary power supply 72 is coupled to a VCC terminal of the control IC 73. A GND terminal of the auxiliary power supply 72 is coupled to the GND. A GATE terminal of the control IC 73 is coupled to an input terminal of the amplifier 74a. An output terminal of the amplifier 74a is coupled to an input terminal of the waveform shaping circuit 74. An output terminal of the waveform shaping circuit 74 is coupled to a gate terminal of the transistor 75.

An IFB terminal of the control IC 73 is coupled to a source terminal of the transistor 75 and one terminal of the resistance element 79a. Another terminal of the resistance element 79a is coupled to the GND. An FB terminal of the control IC 73 is coupled to another terminal of resistance element 79b and one terminal of the resistance element 79c. Another terminal of the resistance element 79c is coupled to the GND.

Here, the common mode filter 71b filters out a harmonic noise from an alternating-current voltage from the alternating-current power supply 71a. The diode bridge 71c rectifies the alternating-current voltage after the noise removal. The capacitor 76a smoothes the rectified input voltage. The inductor 77 is a boost inductor. The inductor 77 boosts the smoothed voltage to a given value. In addition, the signal flowing through the inductor 77 flows to the diode 78. The diode 78 rectifies the signal output from the inductor 77.

The auxiliary power supply 72 includes at least a VCC terminal, a DCout terminal, and a GND terminal. The VCC terminal is a terminal supplied with the output voltage of the diode bridge 71c as a power supply voltage. The DCout terminal is a terminal that outputs a direct-current voltage generated by the auxiliary power supply 72 to the control IC 73. The GND terminal is coupled with the GND.

The control IC 73 includes at least a VCC terminal, a GATE terminal, an IFB terminal, an FB terminal, and a GND terminal. The VCC terminal is a terminal to which the direct-current voltage output from the DCout terminal of the auxiliary power supply 72 is supplied as a power supply voltage.

The GATE terminal is a terminal that outputs a control voltage for switching the transistor 75. The IFB terminal is a terminal for performing feedback detection of a current flowing from the drain terminal to the source terminal of the transistor 75. Incidentally, when the current input to the IFB terminal is an abnormal value, the control IC 73, for example, stops the switching operation of the transistor 75 by setting the control voltage output from the GATE terminal to a given level.

The FB terminal is a terminal that receives a feedback voltage obtained by voltage division of an output voltage by the resistance elements 79b and 79c. Based on the feedback voltage, the control IC 73 adjusts a duty ratio to an appropriate value so that the output voltage is held uniform. The GND terminal is coupled with the GND.

The amplifier 74a amplifies the control voltage output from the control IC 73. When the waveform shaping circuit 74 receives the control voltage after the amplification, the waveform shaping circuit 74 converts the control voltage into a desired operating voltage range of the transistor 75, and outputs a voltage signal after the conversion as a gate voltage. The waveform shaping circuit 10-2 described above, for example, is used as the waveform shaping circuit 74.

The transistor 75 performs switching operation based on the gate voltage output from the waveform shaping circuit 74. When the transistor 75 is off, the signal output from the inductor 77 flows through the diode 78 and charges the capacitor 76b. When the transistor 75 is on, the signal output from the inductor 77 flows to the GND via the resistance element 79a.

Incidentally, in a case where the transistor 75 is a normally on type GaN-HEMT, when the waveform shaping circuit 74 turns on the transistor 75, the waveform shaping circuit 74 applies 0 V as an on voltage signal to the gate terminal of the transistor 75. In addition, when the waveform shaping circuit 74 turns off the transistor 75, the waveform shaping circuit 74 applies a negative voltage as an off voltage signal to the gate terminal of the transistor 75.

(Example of Application to Positive-Negative Pulse Generating Device)

Figure 17:
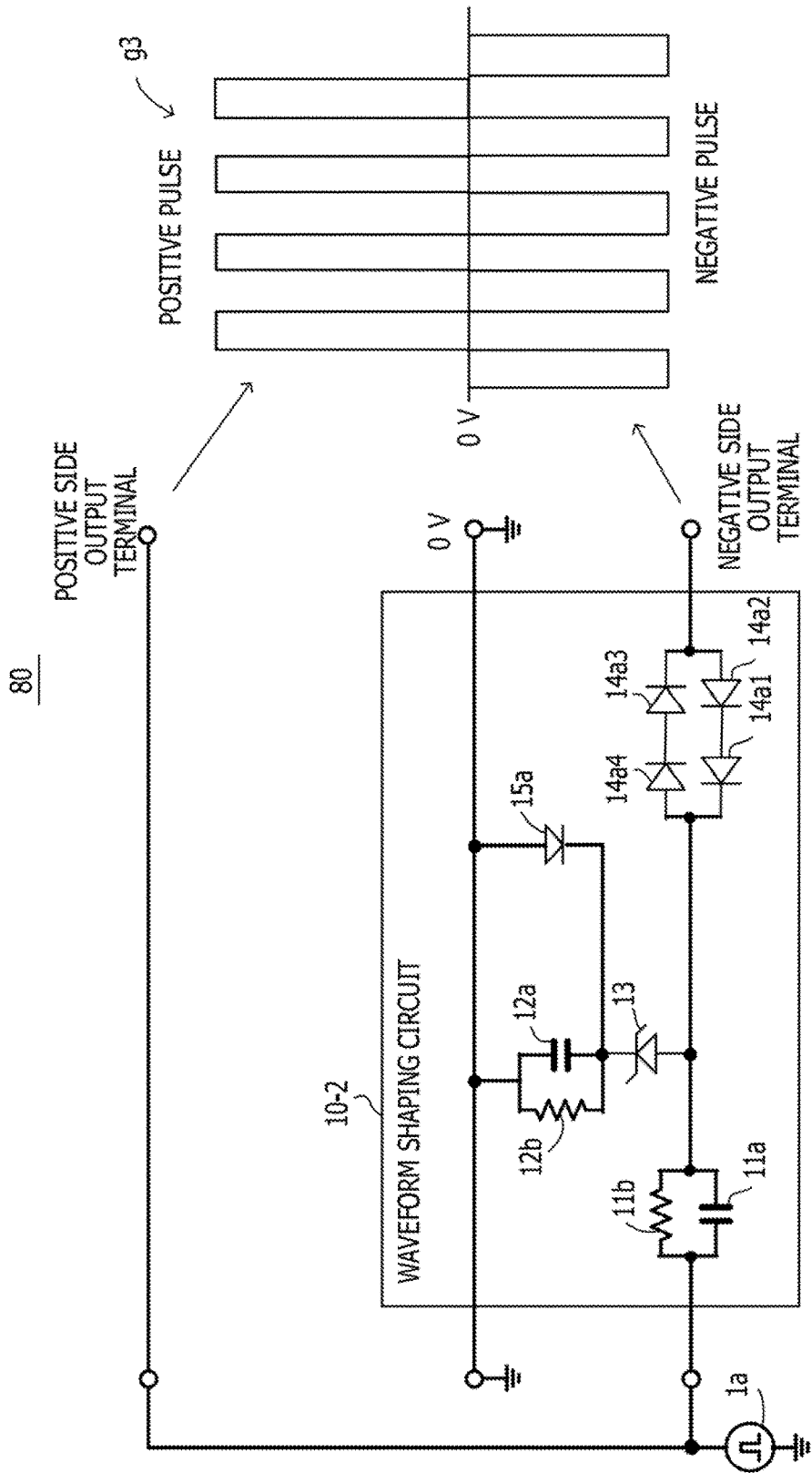
FIG. 17 is a diagram illustrating an example of a positive-negative pulse generating device.

FIG. 17 is a diagram illustrating an example of a positive-negative pulse generating device. In a positive-negative pulse generating device 80, the waveform shaping circuit 10-2 illustrated in FIG. 12 is provided with a positive side output terminal and a negative side output terminal. Incidentally, the positive side output terminal is coupled to an output terminal of a pulse oscillating source 1a, the one terminal of the resistance element 11b, and the one terminal of the capacitor 11a. The negative side output terminal is coupled to the cathode of the diode 14a3 and the anode of the diode 14a2. The other coupling relation is the same as in FIG. 12.

The positive-negative pulse generating device 80 outputs a positive side voltage directly from the pulse oscillating source 1a, whereas the positive-negative pulse generating device 80 outputs a negative side voltage through the waveform shaping circuit 10-2. Suppose that the capacitor 11a has a capacitance C1, the resistance element 11b has a resistance value R1, the capacitor 12a has a capacitance C2, and the resistance element 12b has a resistance value R2. In this case, a negative side pulse signal and a positive side pulse signal may be output alternately in output timing as in a waveform g3 by adjusting the values of C1, R1, C2, and R2 while maintaining a relation C1·R1=C2·R2.

Such a positive-negative pulse generating device 80 may, for example, be used as a bipolar pulse power supply or the like. Because positive and negative pulses are generated by the positive-negative pulse generating device 80, uniform output may be maintained without a change in the shape of the output pulses or a center voltage even when the duty ratio of input pulses is changed.

(Example of Application to Sine Wave Generating Device)

Figure 18:
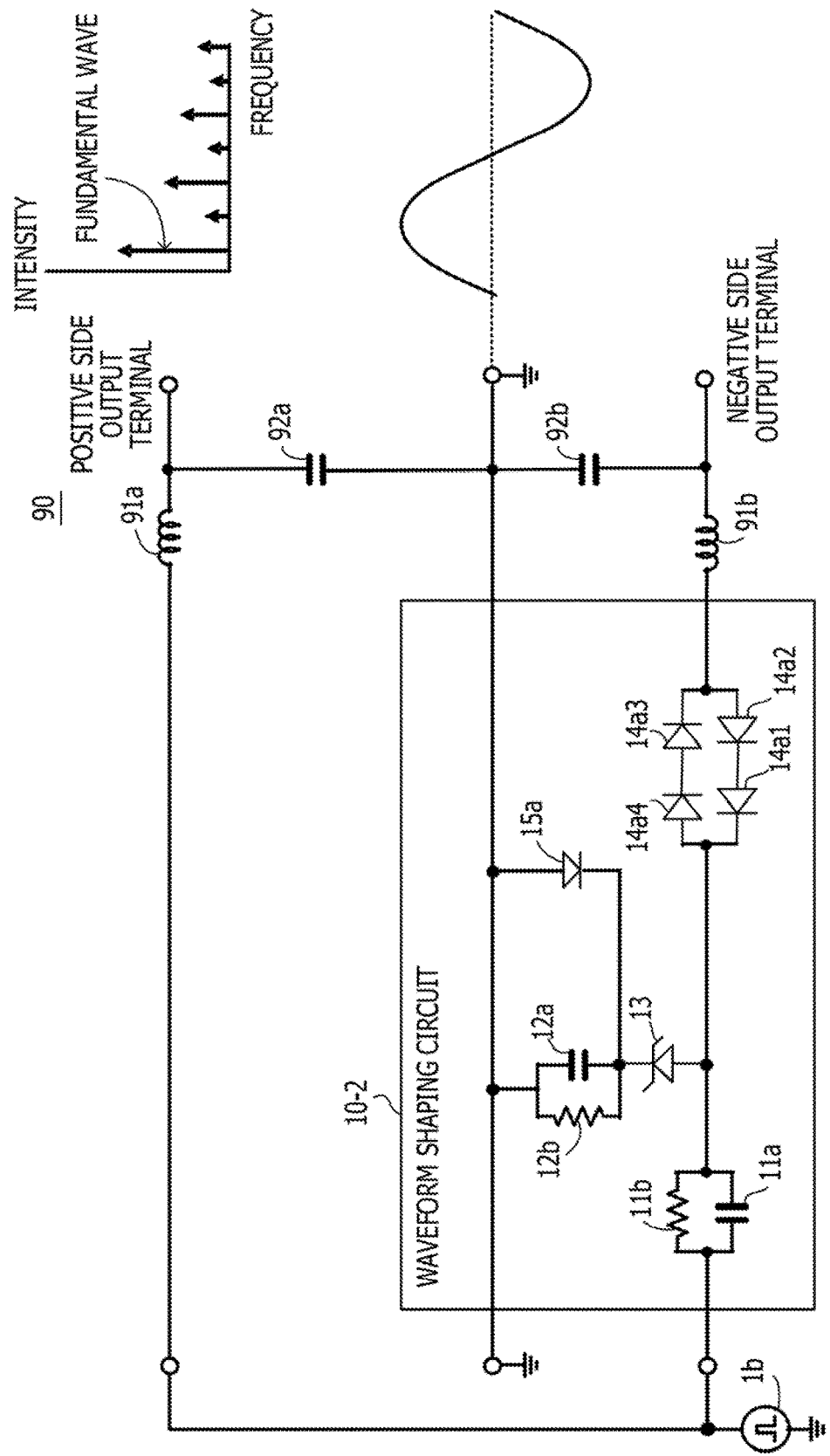
FIG. 18 is a diagram illustrating an example of a sine wave generating device.

FIG. 18 is a diagram illustrating an example of a sine wave generating device. A sine wave generating device 90 is a device configured to generate and output a sine wave, the device being formed by providing the waveform shaping circuit 10-2 illustrated in FIG. 12 with a positive side output terminal, a negative side output terminal, inductors 91a and 91b, and capacitors 92a and 92b.

The positive side output terminal is coupled to one terminal of the inductor 91a and one terminal of the capacitor 92a. Another terminal of the inductor 91a is coupled to an output terminal of a pulse oscillating source 1b, the one terminal of the resistance element 11b, and the one terminal of the capacitor 11a. Another terminal of the capacitor 92a is coupled to one terminal of the capacitor 92b and a GND.

The negative side output terminal is coupled to one terminal of the inductor 91b and another terminal of the capacitor 92b. Another terminal of the inductor 91b is coupled to the cathode of the diode 14a3 and the anode of the diode 14a2. The other coupling relation is the same as in FIG. 12.

In the sine wave generating device 90, suppose that an inductance of the inductor 91a is L1, an inductance of the inductor 91b is L2, a capacitance of the capacitor 92a is C3, and a capacitance of the capacitor 92b is C4. In this case, a sinusoidal signal may be output by outputting fundamental wave components of pulses with L1=L2 and C3=C4 (the duty ratio of the pulses is set at 0.5, for example).

Figure 19:
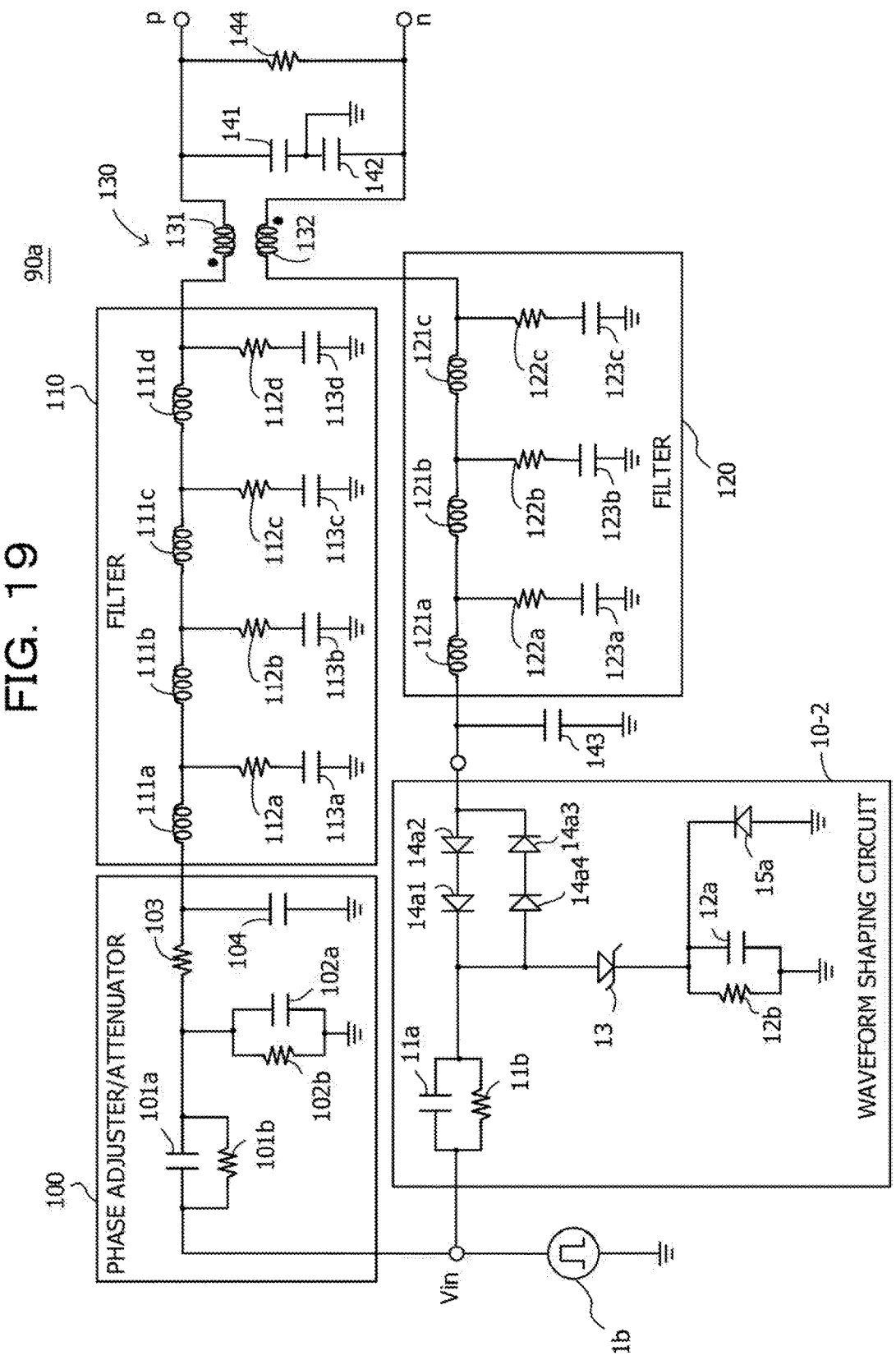
FIG. 19 is a diagram illustrating an example of application of a sine wave generating device.

FIG. 19 is a diagram illustrating an example of application of a sine wave generating device. A sine wave generating device 90a includes the waveform shaping circuit 10-2, a phase adjuster/attenuator 100, filters 110 and 120, a transformer 130, capacitors 141, 142, and 143, and a resistance element 144. The phase adjuster/attenuator 100 includes capacitors 101a, 102a, and 104 and resistance elements 101b, 102b, and 103.

The filter 110 includes inductors 111a, . . . , 111d, resistance elements 112a, . . . , 112d, and capacitors 113a, . . . , 113d. The filter 120 includes inductors 121a, . . . , 121c, resistance elements 122a, . . . , 122c, and capacitors 123a, . . . , 123c.

In coupling relation of each circuit element (description of coupling relation within the waveform shaping circuit 10-2 will be omitted), one terminal of a pulse oscillating source 1b is coupled to one terminal of the resistance element 101b, one terminal of the capacitor 101a, and the input terminal of the waveform shaping circuit 10-2. Another terminal of the pulse oscillating source 1b is coupled to a GND. Another terminal of the capacitor 101a is coupled to another terminal of the resistance element 101b, one terminal of the resistance element 102b, one terminal of the capacitor 102a, and one terminal of the resistance element 103. Another terminal of the capacitor 102a is coupled to another terminal of the resistance element 102b and the GND. Another terminal of the resistance element 103 is coupled to one terminal of the capacitor 104 and one terminal of the inductor 111a. Another terminal of the capacitor 104 is coupled to the GND.

Another terminal of the inductor 111a is coupled to one terminal of the resistance element 112a and one terminal of the inductor 111b. Another terminal of the resistance element 112a is coupled to one terminal of the capacitor 113a. Another terminal of the capacitor 113a is coupled to the GND.

Another terminal of the inductor 111b is coupled to one terminal of the resistance element 112b and one terminal of the inductor 111c. Another terminal of the resistance element 112b is coupled to one terminal of the capacitor 113b. Another terminal of the capacitor 113b is coupled to the GND.

Another terminal of the inductor 111c is coupled to one terminal of the resistance element 112c and one terminal of the inductor 111d. Another terminal of the resistance element 112c is coupled to one terminal of the capacitor 113c. Another terminal of the capacitor 113c is coupled to the GND.

Another terminal of the inductor 111d is coupled to one terminal of the resistance element 112d and one terminal of a primary winding 131 of the transformer 130. Another terminal of the resistance element 112d is coupled to one terminal of the capacitor 113d. Another terminal of the capacitor 113d is coupled to the GND.

Another terminal of the primary winding 131 is coupled to one terminal of the capacitor 141, one terminal of the resistance element 144, and an output terminal p. Another terminal of the resistance element 144 is coupled to an output terminal n, another terminal of the capacitor 142, and one terminal of a secondary winding 132 of the transformer 130.

The output terminal of the waveform shaping circuit 10-2 is coupled to one terminal of the capacitor 143 and one terminal of the inductor 121a. Another terminal of the capacitor 143 is coupled to the GND.

Another terminal of the inductor 121a is coupled to one terminal of the resistance element 122a and one terminal of the inductor 121b. Another terminal of the resistance element 122a is coupled to one terminal of the capacitor 123a. Another terminal of the capacitor 123a is coupled to the GND.

Another terminal of the inductor 121b is coupled to one terminal of the resistance element 122b and one terminal of the inductor 121c. Another terminal of the resistance element 122b is coupled to one terminal of the capacitor 123b. Another terminal of the capacitor 123b is coupled to the GND.

Another terminal of the inductor 121c is coupled to one terminal of the resistance element 122c and another terminal of the secondary winding 132. Another terminal of the resistance element 122c is coupled to one terminal of the capacitor 123c. Another terminal of the capacitor 123c is coupled to the GND.

FIG. 20 is a diagram illustrating an example of an input waveform and an output waveform of a sine wave generating device. A waveform graph g4a represents the waveform of an input voltage Vin. In the waveform graph g4a, an axis of abscissas indicates time (μs), and an axis of ordinates indicates the input voltage Vin (V). A waveform graph g4b represents the waveform of an output voltage V (p, n) between the output terminals p and n. In the waveform graph g4b, an axis of abscissas indicates time (μs), and an axis of ordinates indicates the output voltage V (p, n) (V).

When a pulsed input voltage Vin having a positive side peak value of 20 V is input to the sine wave generating device 90, a uniform sine wave is output as the waveform of the output voltage V (p, n) in a range of −20 V to the vicinity of +25 V. Thus, a sine wave having a positive level and a negative level may be output from the output terminals p and n in response to the pulse input of positive voltage.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A waveform shaping circuit comprising:
   a first parallel circuit including a first capacitance element and a first resistance element coupled in parallel with each other, a positive pulse voltage being applied to a first terminal of the first capacitance element and a second terminal of the first resistance element;

a first rectifier circuit disposed between a point of coupling between a third terminal of the first capacitance element and a fourth terminal of the first resistance element and an output terminal, the first rectifier circuit interrupting a current flowing in a direction from the third terminal and the fourth terminal to the output terminal;

a second parallel circuit including a second capacitance element and a second resistance element coupled in parallel with each other, a fifth terminal of the second capacitance element and a sixth terminal of the second resistance element being at a reference potential;

a Zener diode disposed between a point of coupling between a seventh terminal of the second capacitance element and an eighth terminal of the second resistance element and the point of coupling between the third terminal and the fourth terminal, the Zener diode interrupting a current flowing in a direction from the seventh terminal and the eighth terminal to the third terminal and the fourth terminal at a time of application of a voltage equal to or higher than a Zener voltage; and a second rectifier circuit having one terminal coupled to the seventh terminal and the eighth terminal, and having another terminal at the reference potential, the second rectifier circuit Interrupting a current flowing in a direction from the seventh terminal and the eighth terminal to the reference potential.

2. The waveform shaping circuit according to claim 1, further comprising:

a third rectifier circuit coupled in parallel with the first rectifier circuit, the third rectifier circuit interrupting a current flowing in a direction from the output terminal to the third terminal and the fourth terminal.

3. A semiconductor device comprising:

a first parallel circuit including a first capacitance element and a first resistance element coupled in parallel with each other, a positive pulse voltage being applied to a first terminal of the first capacitance element and a second terminal of the first resistance element;

a first rectifier circuit disposed between a point of coupling between a third terminal of the first capacitance element and a fourth terminal of the first resistance element and an output terminal, the first rectifier circuit interrupting a current flowing in a direction from the third terminal and the fourth terminal to the output terminal;

a second parallel circuit including a second capacitance element and a second resistance element coupled in parallel with each other, a fifth terminal of the second capacitance element and a sixth terminal of the second resistance element being at a reference potential;

a Zener diode disposed between a point of coupling between a seventh terminal of the second capacitance element and an eighth terminal of the second resistance element and the point of coupling between the third terminal and the fourth terminal, the Zener diode interrupting a current flowing in a direction from the seventh terminal and the eighth terminal to the third terminal and the fourth terminal at a time of application of a voltage equal to or higher than a Zener voltage;

a second rectifier circuit having one terminal coupled to the seventh terminal and the eighth terminal, and having another terminal at the reference potential, the second rectifier circuit interrupting a current flowing in a direction from the seventh terminal and the eighth terminal to the reference potential; and a field-effect transistor electrically coupled to the output terminal.

4. A switching power supply device comprising:

a field-effect transistor configured to output a pulsed alternating-current signal by switching operation;

a control circuit configured to output a control signal that controls the switching operation of the field-effect transistor;

an amplifier configured to amplify the control signal;

a first parallel circuit including a first capacitance element and a first resistance element coupled in parallel with each other, the control signal after being amplified being applied as a positive pulse voltage to a first terminal of the first capacitance element and a second terminal of the first resistance element;

a first rectifier circuit disposed between a point of coupling between a third terminal of the first capacitance element and a fourth terminal of the first resistance element and an output terminal electrically coupled to a gate terminal of the field-effect transistor, the first rectifier circuit interrupting a current flowing in a direction from the third terminal and the fourth terminal to the output terminal;

a second parallel circuit including a second capacitance element and a second resistance element coupled in parallel with each other, a fifth terminal of the second capacitance element and a sixth terminal of the second resistance element being at a reference potential;

a Zener diode disposed between a point of coupling between a seventh terminal of the second capacitance element and an eighth terminal of the second resistance element and the point of coupling between the third terminal and the fourth terminal, the Zener diode Interrupting a current flowing in a direction from the seventh terminal and the eighth terminal to the third terminal and the fourth terminal at a time of application of a voltage equal to or higher than a Zener voltage;

a second rectifier circuit having one terminal coupled to the seventh terminal and the eighth terminal, and having another terminal at the reference potential, the second rectifier circuit interrupting a current flowing in a direction from the seventh terminal and the eighth terminal to the reference potential; and a third rectifier circuit coupled in parallel with the first rectifier circuit, the third rectifier circuit interrupting a current flowing in a direction from the output terminal to the third terminal and the fourth terminal.

* * * * *